(12) United States Patent
Noda et al.

(10) Patent No.: US 8,946,066 B2
(45) Date of Patent: Feb. 3, 2015

(54) METHOD OF MANUFACTURING SEMICONDUCTOR DEVICE

(75) Inventors: Kosei Noda, Atsugi (JP); Shunpei Yamazaki, Setagaya (JP); Tatsuya Honda, Isehara (JP); Yusuke Sekine, Yamato (JP); Hiroyuki Tomatsu, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/461,808

(22) Filed: May 2, 2012

(65) Prior Publication Data
US 2012/0286260 A1    Nov. 15, 2012

(30) Foreign Application Priority Data
May 11, 2011    (JP) .................. 2011-106054

(51) Int. Cl.
*H01L 21/20* (2006.01)
*H01L 27/115* (2006.01)
(Continued)

(52) U.S. Cl.
CPC ............ *H01L 27/1156* (2013.01); *H01L 21/84* (2013.01); *H01L 27/10873* (2013.01);
(Continued)

(58) Field of Classification Search
CPC ............ H01L 29/7869; H01L 27/1225; H01L 29/66757; H01L 29/78606; H01L 21/16
USPC ............ 257/43, E29.296, E29.094, E21.324, 257/E21.334, 64; 438/104, 166, 486, 303, 438/502
See application file for complete search history.

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Dale E Page
(74) *Attorney, Agent, or Firm* — Eric J. Robinson; Robinson Intellectual Property Law Office, P.C.

(57) ABSTRACT

A highly reliable transistor which includes an oxide semiconductor and has high field-effect mobility and in which a variation in threshold voltage is small is provided. By using the transistor, a high-performance semiconductor device, which has been difficult to realize, is provided. The transistor includes an oxide semiconductor film which contains two or more kinds, preferably three or more kinds of elements selected from indium, tin, zinc, and aluminum. The oxide semiconductor film is formed in a state where a substrate is heated. Further, oxygen is supplied to the oxide semiconductor film with an adjacent insulating film and/or by ion implantation in a manufacturing process of the transistor, so that oxygen deficiency which generates a carrier is reduced as much as possible. In addition, the oxide semiconductor film is highly purified in the manufacturing process of the transistor, so that the concentration of hydrogen is made extremely low.

14 Claims, 28 Drawing Sheets

(51) Int. Cl.
*H01L 21/84* (2006.01)
*H01L 27/108* (2006.01)
*H01L 27/12* (2006.01)
*H01L 29/66* (2006.01)
*H01L 29/786* (2006.01)
*H01L 21/02* (2006.01)

(52) U.S. Cl.
CPC ...... *H01L27/1203* (2013.01); *H01L 29/66742* (2013.01); *H01L 29/78603* (2013.01); *H01L 29/7869* (2013.01); *H01L 21/0242* (2013.01); *H01L 21/02554* (2013.01); *H01L 21/02656* (2013.01); *H01L 21/02595* (2013.01)
USPC ...................... 438/502; 257/43; 257/E45.043

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0140053 | A1* | 6/2009 | Yamazaki et al. ............ 235/492 |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0163868 | A1 | 7/2010 | Yamazaki et al. |
| 2010/0285632 | A1 | 11/2010 | Inoue et al. |
| 2011/0068336 | A1* | 3/2011 | Yamazaki et al. ............... 257/43 |
| 2011/0210328 | A1 | 9/2011 | Yamazaki et al. |
| 2011/0212571 | A1 | 9/2011 | Yamazaki et al. |
| 2011/0215318 | A1 | 9/2011 | Yamazaki et al. |
| 2011/0215319 | A1 | 9/2011 | Yamazaki et al. |
| 2012/0012847 | A1 | 1/2012 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al.: "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H at al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposoum Digest of Technical Papers, May 31, 2009, pp. 1110-1112.
Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases For Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu, or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physcial Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janottla et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Fukumoto.E et al., "High Mobility Oxide Semiconductor TFT for Circuit Integration of AM-OLED,", IDW '10 : Proceedings of the 16th International Display Workshops, Dec. 1, 2010, pp. 631-634.

Morosawa.N et al., "35.3: Distinguished Paper: A Novel Self-Aligned Top-Gate Oxide TFT for AM-OLED Displays,", SID Digest '11 : SID International Symposium Digest of Technical Papers, May 17, 2011, pp. 479-482.

* cited by examiner c-axis direction electric charge: 0 electric charge: 1 electric charge: 0 electric charge: −1 electric charge 0 a-b plane medium group

● In
☾ Sn
☾ Zn
● O

METHOD OF MANUFACTURING SEMICONDUCTOR DEVICE

BACKGROUND OF THE INVENTION

1. Field of the Invention

The present invention relates to a semiconductor device including a semiconductor element such as a transistor which includes an oxide semiconductor, and a method for manufacturing the semiconductor device.

In this specification, a semiconductor device generally refers to a device which can function by utilizing semiconductor characteristics; an electro-optical device, a light-emitting display device, and an electronic device are all included in the category of the semiconductor device.

2. Description of the Related Art

Many transistors formed over a glass substrate or the like are manufactured using amorphous silicon, polycrystalline silicon, or the like, as typically seen in liquid crystal display devices. Although a transistor manufactured using amorphous silicon has low field-effect mobility, it can be formed over a larger glass substrate. On the other hand, although a transistor manufactured using polycrystalline silicon has high field-effect mobility, it is not suitable for being formed over a larger glass substrate.

In recent years, other than a transistor formed using silicon, a technique in which transistors are manufactured using an oxide semiconductor and applied to electronic devices or optical devices has attracted attention. A technique in which a transistor is manufactured using zinc oxide or an In—Ga—Zn—O-based oxide, for example, as an oxide semiconductor and used for a switching element of a pixel of a display device or the like is disclosed in Patent Document 1 and Patent Document 2.

A transistor including an oxide semiconductor film is expected to considerably improve performance of a display device because such a transistor has higher field-effect mobility than a transistor including amorphous silicon.

However, in a semiconductor device in which a transistor needs to have high field-effect mobility, a transistor including polycrystalline silicon or single crystal silicon is used in many cases. In the case where a transistor including an oxide semiconductor is used in a semiconductor device other than a display device, field-effect mobility as high as that of a transistor including polycrystalline silicon or single crystal silicon is needed in some cases.

A transistor including an In—Sn—Zn—O-based oxide and having high field-effect mobility is disclosed (see Non-Patent Document 1).

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED," IDW'10, pp. 631-634.

SUMMARY OF THE INVENTION

There is a possibility of application of a transistor including an oxide semiconductor to a semiconductor device in which a transistor needs to have high field-effect mobility.

However, transistors including oxide semiconductors, whose electrical characteristics can be changed by a bias-temperature (BT) test, a light bias test, or the like, are not sufficiently reliable.

Thus, an object of one embodiment of the present invention is to provide a highly reliable transistor which includes an oxide semiconductor and has high field-effect mobility and in which a variation in threshold voltage is small.

Further, another object of one embodiment of the present invention is to provide a high-performance semiconductor device, which has been difficult to realize, with the use of a highly reliable transistor which has high field-effect mobility and in which a variation in threshold voltage is small.

An oxide semiconductor used in a transistor that is one embodiment of the present invention contains two or more kinds, preferably three or more kinds of elements selected from indium, tin, zinc, and aluminum.

Further, oxygen is supplied to the oxide semiconductor with an adjacent insulating film and/or by ion implantation in the manufacturing process of the transistor, so that oxygen deficiency which generates a carrier is reduced.

In addition, the oxide semiconductor is highly purified in the manufacturing process of the transistor, so that the concentration of hydrogen serving as a carrier generation source is made extremely low.

A method for manufacturing a transistor which is one embodiment of the present invention is described below.

The following steps are performed sequentially: treatment for reducing impurities such as hydrogen which is adsorbed on a substrate surface; formation of a base insulating film; formation of an oxide semiconductor film; and first heat treatment. The base insulating film is preferably an insulating film from which oxygen is released by heat treatment. Note that in the case where the substrate surface is sufficiently clean, the step of performing the treatment for reducing impurities adsorbed on the substrate surface may be omitted.

As the treatment for reducing impurities adsorbed on the substrate surface, plasma treatment, heat treatment, or chemical treatment is performed, for example. It is preferred to perform plasma treatment. Specifically, the substrate surface can be subjected to plasma treatment in such a manner that plasma is generated in an atmosphere containing a rare gas (e.g., helium, neon, argon, krypton, or xenon), oxygen, or nitrogen and bias voltage is applied to the substrate. A reduction in impurities on the substrate surface leads a reduction in interface state density between the substrate and the base insulating film. Interface states can cause a variation in threshold voltage of a transistor. Thus, when the interface state density is reduced, threshold voltage difference between the transistors within the substrate surface or a reduction in the reliability can be prevented.

It is preferable that after the treatment for reducing impurities adsorbed on the substrate surface, the base insulating film be formed without being exposed to the air. In that case, the impurities can be prevented from being adsorbed on the substrate surface again as a result of exposure to the air.

When an insulating film from which oxygen is released by heat treatment is provided as the base insulating film, oxygen deficiency caused in the oxide semiconductor film can be repaired by heat treatment in a later step. Oxygen deficiency in the oxide semiconductor film generates a carrier, which can cause a variation in the threshold voltage of the obtained transistor.

In addition, when the base insulating film from which oxygen is released by heat treatment is provided, interface state density between the base insulating film and the oxide semiconductor film can be reduced. An interface state traps an electric charge generated as a result of operation of the obtained transistor in some cases and thus can be a factor that causes a reduction in reliability of the transistor.

Note that the base insulating film is preferably flat. Specifically, the base insulating film has an average surface roughness ($R_a$) of 1 nm or less, preferably 0.3 nm or less, further preferably 0.1 nm or less. The base insulating film may be subjected to planarization treatment such as chemical mechanical polishing (CMP) treatment. When the base insulating film is flat, the state of an interface between the base insulating film and the oxide semiconductor film is favorable, whereby field-effect mobility can be increased and a variation in the threshold voltage can be reduced in the obtained transistor.

For the oxide semiconductor film, an In—Al—Sn—Zn—O-based material, an In—Sn—Zn—O-based material, an In—Al—Zn—O-based material, a Zn—Sn—O-based material, or the like is used. In particular, an In—Sn—Zn—O-based material is preferably used because in that case, the transistor can have high field-effect mobility and high reliability.

Note that the oxide semiconductor film is preferably formed while the substrate is heated because in that case, the obtained transistor can have increased field-effect mobility. Substrate heating temperature at the time of formation of the oxide semiconductor film is higher than or equal to 100° C. and lower than or equal to 600° C., preferably higher than or equal to 150° C. and lower than or equal to 550° C., further preferably higher than or equal to 200° C. and lower than or equal to 500° C. The oxide semiconductor film is preferably formed by a sputtering method.

Note that the band gap of the oxide semiconductor film is 2.5 eV or more, preferably 2.8 eV or more, further preferably 3.0 eV or more. When the band gap of the oxide semiconductor film is in the above range, the transistor can have extremely low off-state current.

The oxide semiconductor film is in a single crystal state, a polycrystalline (also referred to as polycrystal) state, an amorphous state, or the like.

Preferably, a c-axis aligned crystalline oxide semiconductor (CAAC-OS) film can be used as the oxide semiconductor film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits inside a cube whose one side is less than 100 nm. From an observation image obtained with a transmission electron microscope (TEM), a boundary between the amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement when seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electrical characteristics of the transistor due to irradiation with visible light or ultraviolet light can be reduced. Thus, the transistor has high reliability.

The first heat treatment is preferably performed after the oxide semiconductor film is formed. The first heat treatment is performed in a reduced-pressure atmosphere (10 Pa or lower), an inert atmosphere (an atmosphere of an inert gas such as nitrogen or a rare gas), or an oxidizing atmosphere (an atmosphere containing an oxidizing gas such as oxygen, ozone, or nitrous oxide at 10 ppm or more) at a temperature higher than or equal to 250° C. and lower than or equal to 650° C., preferably higher than or equal to 300° C. and lower than or equal to 600° C.

By the first heat treatment, the concentration of impurities such as hydrogen in the oxide semiconductor film can be reduced. Alternatively, the state of the interface between the base insulating film and the oxide semiconductor film can be made favorable. Since the first heat treatment is performed after the oxide semiconductor film is formed, outward diffusion of oxygen that is released from the base insulating film can be prevented. Note that it is alternatively possible that heat treatment is performed in an inert atmosphere or a reduced-pressure atmosphere, the atmosphere is then changed to an oxidizing atmosphere without changing the temperature, and heat treatment is performed in the oxidizing atmosphere. When the first heat treatment is performed in this manner, impurities in the oxide semiconductor film can be reduced in the inert atmosphere or the reduced-pressure atmosphere and then oxygen deficiency caused at the time of removal of impurities can be reduced in the oxidizing atmosphere.

Note that a gas containing fewer impurities is used for the heat treatment and film formation. It is particularly preferable to use a gas containing less moisture. Specifically, a gas whose dew point is −70° C. or lower can be used.

After the first heat treatment, the oxide semiconductor film is processed into an island shape. Processing of the oxide semiconductor film can be performed in such a manner that a resist mask is formed with the use of a photomask and a part in which the resist mask is not formed is etched by a dry etching method or a wet etching method. Such a process is called photolithography process.

Then, a conductive film is formed and processed by a photolithography process, so that a source electrode and a drain electrode which are at least partly in contact with the oxide semiconductor film are formed.

After that, a gate insulating film and a conductive film are sequentially formed and the conductive film is processed by a photolithography process or the like, so that a gate electrode overlapping with the oxide semiconductor film is formed. It is preferable that an insulating film from which oxygen is released by heat treatment be used as the gate insulating film.

Next, second heat treatment is performed. The second heat treatment can be performed under a condition similar to that of the first heat treatment. By the second heat treatment, oxygen is released from the base insulating film and the gate insulating film, so that oxygen deficiency in the oxide semiconductor film can be reduced. Moreover, interface state density between the base insulating film and the oxide semiconductor film and interface state density between the oxide semiconductor film and the gate insulating film can be reduced, whereby in the obtained transistor, field-effect mobility can be increased, a variation in threshold voltage can be reduced and the reliability can be improved.

In the above-described manner, a highly reliable transistor can be manufactured which includes an oxide semiconductor and has high field-effect mobility and in which a variation in threshold voltage is small.

Note that an interlayer insulating film is preferably formed to cover the transistor. By provision of the interlayer insulating film, outward diffusion of oxygen that is released from the base insulating film and the gate insulating film from the transistor can be prevented. In the case where the interlayer insulating film is provided, the second heat treatment may be performed after formation of the interlayer insulating film.

The transistor preferably has a top-gate structure. That is, a structure in which an oxide semiconductor film is formed before a gate electrode is preferable. When a top-gate structure is employed, an oxide semiconductor film including a channel region, a source region, and a drain region can be formed in a self-aligned manner with the use of a gate electrode as a mask. Since the gate electrode hardly overlaps with the source region and the drain region, parasitic capacitance can be made small and a transistor can be miniaturized. Moreover, the use of the gate electrode as a mask can lead a simplified process in which no photomask is needed for formation of the channel region, the source region, and the drain region. Note that a bottom-gate structure is not excluded.

A transistor which is obtained in the above manner has high field-effect mobility (e.g., a field-effect mobility of 31 $cm^2$/Vs or more), a small variation in threshold voltage, high reliability (e.g., a fluctuation range of threshold voltage by a negative BT test is 1 V or less), and extremely low off-state current (e.g., off-state current per micrometer of channel width is 10 zA or lower when a channel length is 3 μm and a substrate temperature is 85° C.), thereby enabling manufacture of a high-performance semiconductor device, which has been difficult to realize.

According to one embodiment of the present invention, a highly reliable transistor which includes an oxide semiconductor and has high field-effect mobility and in which a variation in threshold voltage is small can be provided.

Further, with the use of a transistor obtained in the above manner, a high-performance semiconductor device, which has been difficult to realize, can be provided.

DETAILED DESCRIPTION OF THE INVENTION

Figure 1A:
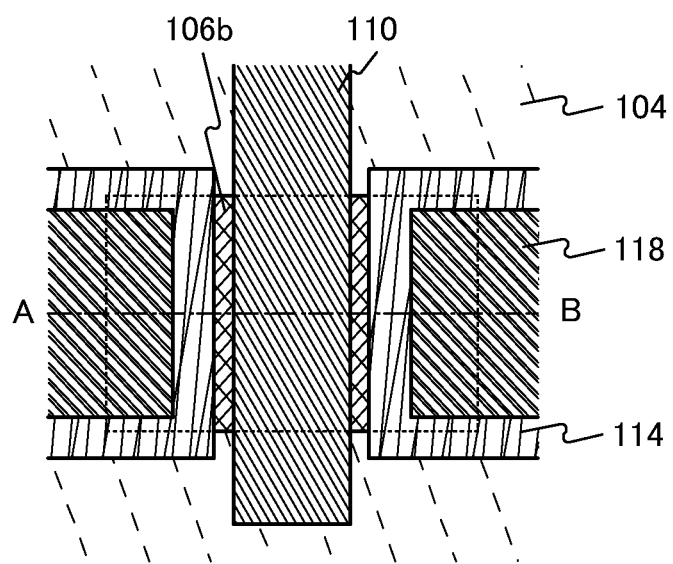
FIGS. 1A and 1B are a top view and a cross-sectional view of a transistor according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways. Further, the present invention is not construed as being limited to the description of the embodiments below. In describing structures of the present invention with reference to the drawings, the same reference numerals are used in common for the same portions in different drawings. Note that the same hatch pattern is applied to similar parts, and the similar parts are not especially denoted by reference numerals in some cases.

Terms used in this specification will be briefly explained.

When one of a source and a drain of a transistor is called a drain, the other is called a source. That is, they are not distinguished depending on the potential level. Therefore, a portion called a source in this specification may be alternatively referred to as a drain.

A voltage refers to a potential difference with respect to a reference potential (e.g., a ground potential (GND)) in many cases. Accordingly, a voltage may be called a potential and vice versa.

Even when the phrase "A is connected to B" is used, there is a case where no physical connection between A and B is made in an actual circuit and a line is extended between A and B.

Note that the ordinal numbers such as "first" and "second" in this specification are used for convenience and do not denote the order of steps or the stacking order of layers. In addition, the ordinal numbers do not denote particular names which specify the invention.

Embodiment 1

In this embodiment, an example of a transistor which is one embodiment of the present invention will be described with reference to FIGS. 1A and 1B, FIGS. 2A to 2F, FIGS. 3A to 3D, FIGS. 4A to 4C, and the like.

Figure 1B:
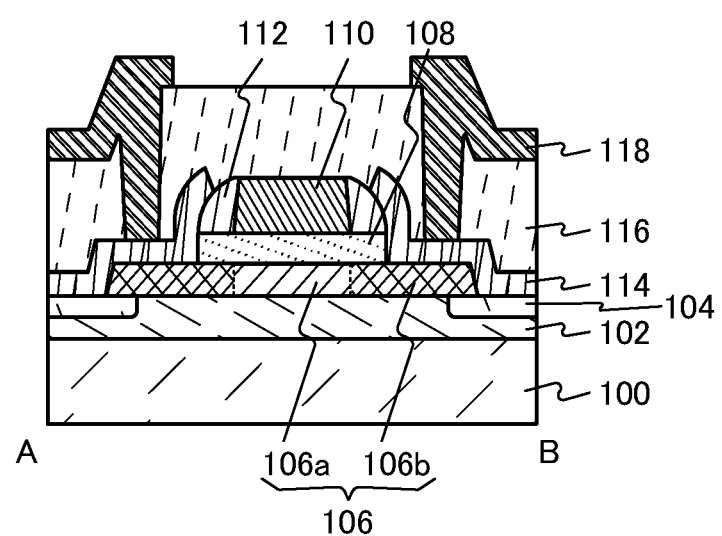

FIGS. 1A and 1B are a top view and a cross-sectional view of a transistor having a top-gate top-contact structure. FIG. 1A is the top view of the transistor. FIG. 1B shows a cross-section A-B along dashed-dotted line A-B in FIG. 1A.

The transistor illustrated in FIG. 1B includes a base insulating film 102 provided over a substrate 100; a protective insulating film 104 provided in the periphery of the base insulating film 102; an oxide semiconductor film 106 provided over the base insulating film 102 and the protective insulating film 104 and including a high-resistance region 106a and low-resistance regions 106b; a gate insulating film 108 provided over the oxide semiconductor film 106; a gate electrode 110 provided to overlap with the oxide semiconductor film 106 with the gate insulating film 108 provided therebetween; sidewall insulating films 112 provided in contact with side surfaces of the gate electrode 110; a pair of electrodes 114 provided in contact with at least the oxide semiconductor film 106; an interlayer insulating film 116 provided to cover at least the oxide semiconductor film 106, the gate electrode 110, and the pair of electrodes 114; and a wiring 118 provided to be connected to at least one of the pair of electrodes 114 through an opening portion formed in the interlayer insulating film 116.

Although not illustrated, a protective film may be provided to cover the interlayer insulating film 116 and the wiring 118. With the protective film, a minute amount of leakage current generated by surface conduction of the interlayer insulating film 116 can be reduced and thus the off-state current of the transistor can be reduced. For the protective film, a material selected from an acrylic resin, a polyimide resin, an epoxy resin, a silicone resin, and the like can be used.

Off-state current refers to drain current which flows in a transistor in an off state. An off state of a transistor refers to a state where gate voltage is lower than threshold voltage in an n-channel transistor. Alternatively, an off state of a transistor refers to a state where gate voltage is higher than threshold voltage in a p-channel transistor. Drain current refers to current between a source and a drain of a transistor. Further, gate voltage refers to a potential difference between a source potential and a gate potential when the source potential is used as a reference potential.

In some cases, off-state current refers to drain current which flows in a normally-off transistor when gate voltage is 0 V. A normally-off transistor refers to an n-channel transistor whose threshold voltage is higher than 0 V. Alternatively, a normally-off transistor refers to a p-channel transistor whose threshold voltage is lower than 0 V.

The thickness of the oxide semiconductor film 106 is greater than or equal to 1 nm and less than or equal to 40 nm, preferably greater than or equal to 3 nm and less than or equal to 20 nm. In particular, in the case where the transistor has a channel length of 30 nm or less and the oxide semiconductor film 106 has a thickness of around 5 nm, a short channel effect can be suppressed and stable electrical characteristics can be obtained.

For the oxide semiconductor film 106, an In—Al—Sn—Zn—O-based material, an In—Sn—Zn—O-based material, an In—Al—Zn—O-based material, a Zn—Sn—O-based material, or the like can be used, for example. Here, for example, an In—Sn—Zn—O-based material means an oxide containing indium, tin, and zinc, and there is no particular limitation on the composition ratio. With the use of any of the above materials for the oxide semiconductor film 106, a transistor with high field-effect mobility can be obtained.

The oxide semiconductor film 106 is formed using a material whose band gap is 2.5 eV or more, preferably 2.8 eV or more, further preferably 3.0 eV or more in order to reduce the off-state current of the transistor. With the use of the oxide semiconductor film 106 with a band gap in the above range, the off-state current of the transistor can be reduced.

Note that it is preferable that in the oxide semiconductor film 106, hydrogen, an alkali metal, an alkaline earth metal, and the like be reduced and the concentration of impurities be extremely low. When the oxide semiconductor film 106 contains any of the above impurities, recombination in a band gap occurs owing to a level formed by the impurity, so that the transistor has increased off-state current.

The concentration of hydrogen in the oxide semiconductor film 106, which is measured by secondary ion mass spectrometry (SIMS), is lower than $5\times10^{19}$ cm$^{-3}$, preferably $5\times10^{18}$ $cm^{-3}$ or lower, further preferably $1\times10^{18}$ $cm^{-3}$ or lower, still further preferably $5\times10^{17}$ $cm^{-3}$ or lower.

Further, as for alkali metal concentration in the oxide semiconductor film 106, which is measured by SIMS, the concentration of sodium is $5\times10^{16}$ $cm^{-3}$ or lower, preferably $1\times10^{16}$ $cm^{-3}$ or lower, further preferably $1\times10^{15}$ $cm^{-3}$ or lower; the concentration of lithium is $5\times10^{15}$ $cm^{-3}$ or lower, preferably $1\times10^{15}$ $cm^{-3}$ or lower; and the concentration of potassium is $5\times10^{15}$ $cm^{-3}$ or lower, preferably $1\times10^{15}$ $cm^{-3}$ or lower.

A transistor including the above-described oxide semiconductor film 106 has high field-effect mobility and low off-state current. Specifically, the transistor can have a field-effect mobility of 31 $cm^2/Vs$ or more, 40 $cm^2/Vs$ or more, 60 $cm^2/Vs$ or more, 80 $cm^2/Vs$ or more, or 100 $cm^2/Vs$ or more; for example, off-state current when the channel length is 3 μm and the channel width is 1 μm can be $1\times10^{-18}$ A or lower, $1\times10^{-21}$ A or lower, or $1\times10^{-24}$ A or lower.

The oxide semiconductor film 106 is preferably non-single-crystal. If operation of the transistor or light or heat from the outside causes oxygen deficiency in the oxide semiconductor film 106 which is completely single crystal, a carrier due to the oxygen deficiency is generated in the oxide semiconductor film 106 owing to the absence of oxygen between lattices which repair the oxygen deficiency; as a result, the threshold voltage of the transistor shifts in the negative direction in some cases.

The oxide semiconductor film 106 preferably has crystallinity. For example, a polycrystalline film or a CAAC-OS film is used.

An example of a crystal structure included in a CAAC-OS film will be described in detail with reference to FIGS. 23A to 23D and FIGS. 24A to 24C. In FIGS. 23A to 23D and FIGS. 24A to 24C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Further, in FIGS. 23A to 23D, O surrounded by a circle represents tetracoordinate O and O surrounded by a double circle represents tricoordinate O.

Figure 23A:
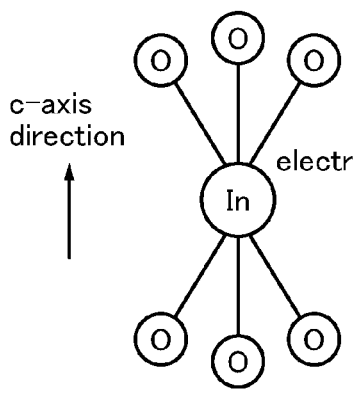
FIGS. 23A to 23E illustrate crystal structures of an oxide semiconductor according to one embodiment of the present invention.

FIG. 23A illustrates a structure including one hexacoordinate In atom and six tetracoordinate oxygen (hereinafter referred to as tetracoordinate O) atoms proximate to the In atom. Such a structure in which one metal atom and proximate oxygen atoms to the metal atom are only illustrated is called a small group here. The structure in FIG. 23A is actually an octahedral structure, but is illustrated as a planar structure for simplicity. Note that three tetracoordinate O atoms exist in each of an upper half and a lower half in FIG. 23A. In the small group illustrated in FIG. 23A, electric charge is 0.

Figure 23B:
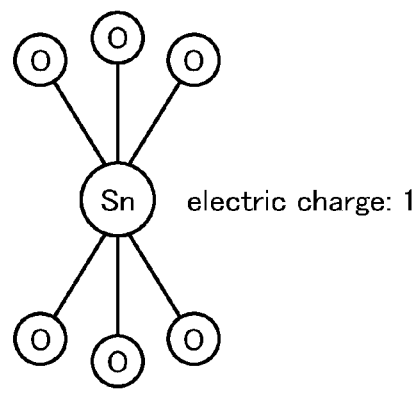
Figure 23C:
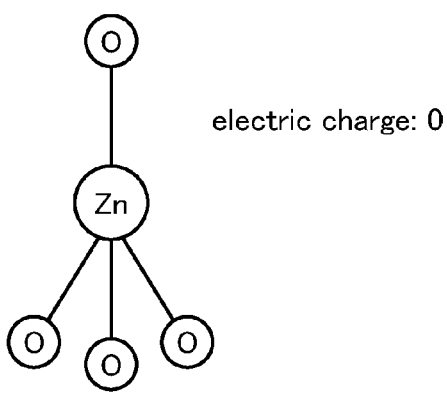

FIG. 23C illustrates a structure including one tetracoordinate Zn atom and four tetracoordinate O atoms proximate to the Zn atom. In FIG. 23C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 23C. In the small group illustrated in FIG. 23C, electric charge is 0.

FIG. 23B illustrates a structure including one hexacoordinate Sn atom and six tetracoordinate O atoms proximate to the Sn atom. In FIG. 23B, three tetracoordinate O atoms exist in an upper half and three tetracoordinate O atoms exist in a lower half. In the small group illustrated in FIG. 23B, electric charge is +1.

Figure 23D:
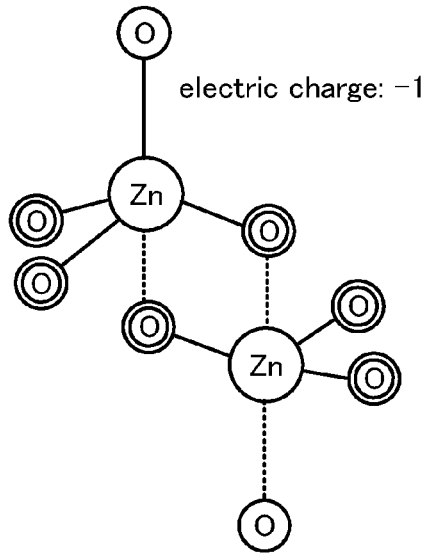

FIG. 23D illustrates a structure including two Zn atoms. In FIG. 23D, one tetracoordinate O atom exists in an upper half and one tetracoordinate O atom exists in a lower half. In the small group illustrated in FIG. 23D, electric charge is −1.

Figure 23E:
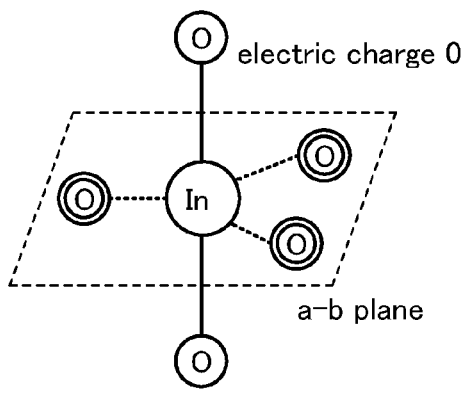

FIG. 23E illustrates a structure including one pentacoordinate In atom, three tricoordinate O atoms close to the In atom, and two tetracoordinate O atoms close to the In atom. All the tricoordinate O atoms exist in the a-b plane. One tetracoordinate O atom exists in each of an upper half and a lower half in FIG. 23E. In a small group illustrated in FIG. 23E, electric charge is 0.

Here, a plurality of small groups form a medium group, and a plurality of medium groups form a large group (also referred to as unit cell).

Now, a rule of bonding between the small groups is described. The three O atoms in the upper half with respect to the hexacoordinate In atom in FIG. 23A each have three proximate In atoms in the downward direction, and the three O atoms in the lower half each have three proximate In atoms in the upward direction. The one O atom in the upper half with respect to the tetracoordinate Zn atom in FIG. 23C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal atom (In or Sn) is bonded through three tetracoordinate O atoms in the lower half, it is bonded to the pentacoordinate metal atom (In) or the tetracoordinate metal atom (Zn).

Metal atoms each of which has a coordination number of 4, 5, or 6 are bonded through a tetracoordinate O atom in the c-axis direction. In addition to the above, a medium group can be formed in a different manner by combining a plurality of small groups so that the total electric charge of the layered structure is 0.

Figure 24A:
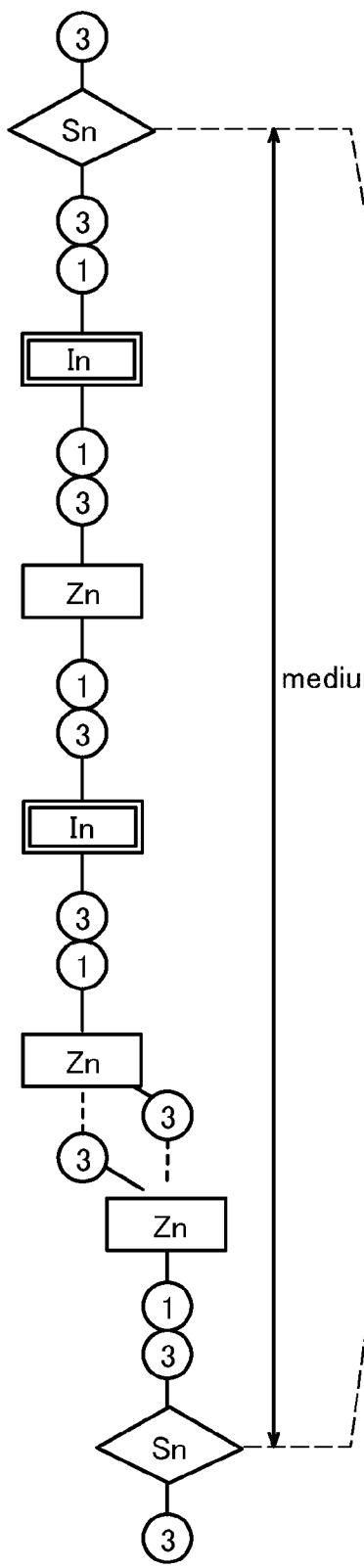
FIGS. 24A to 24C illustrate a crystal structure of an oxide semiconductor according to one embodiment of the present invention.
Figure 24B:
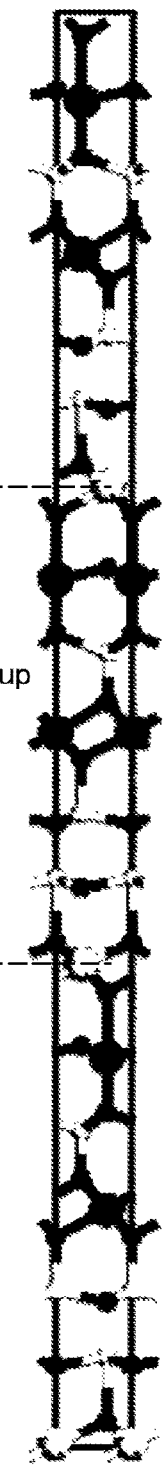
Figure 24C:
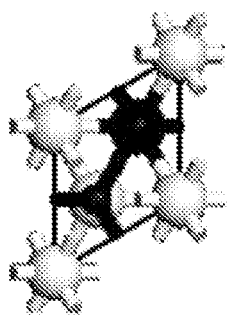

FIG. 24A illustrates an example of a model of a medium group constituting a layered structure of an In—Sn—Zn—O-based material. FIG. 24B illustrates a large group including three medium groups. FIG. 24C illustrates an atomic arrangement in the case where the layered structure in FIG. 24B is observed from the c-axis direction.

In FIG. 24A, for simplicity, a tricoordinate O atom is omitted and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 24A, one tetracoordinate O atom existing in each of an upper half and a lower half with respect to an In atom is denoted by circled 1. In a similar manner, FIG. 24A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group constituting the layered structure of the In—Sn—Zn—O-based material in FIG. 24A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed. Note that medium groups included in a large group do not necessarily have the same structure.

Here, electric charge of a tricoordinate O atom for making one bond and electric charge of a tetracoordinate O atom for making one bond can be assumed to be −0.667 and −0.5, respectively. For example, electric charge of (hexacoordinate or pentacoordinate) In, electric charge of (tetracoordinate) Zn, and electric charge of (pentacoordinate or hexacoordinate) Sn are +3, +2, and +4, respectively. Thus, electric charge of a small group including Sn is +1. Therefore, electric charge of −1, which cancels +1, is needed to form a layered structure including Sn. As a structure having electric charge of −1, the small group including two Zn atoms as illustrated in FIG. 23D can be given. For example, with one small group including two Zn atoms, electric charge of one small group including a Sn atom can be cancelled, so that the total electric charge of the layered structure can be 0.

When the large group illustrated in FIG. 24B is repeated, an In—Sn—Zn—O-based crystal ($In_2SnZn_3O_8$) can be obtained. Note that a layered structure of the obtained In—Sn—Zn—O-based material can be expressed as a composition formula, $In_2SnZn_2O_7(ZnO)_m$ (m is 0 or a natural number).

The same applies to the case of using an In—Al—Sn—Zn—O-based material, an In—Al—Zn—O-based material, a Sn—Zn—O-based material, or the like.

A CAAC-OS film is easily formed when a film serving as a base thereof is flat. Specifically, the film serving as a base is provided so as to have an average surface roughness ($R_a$) of 1 nm or less, preferably 0.3 nm or less, further preferably 0.1 nm or less. Note that $R_a$ is obtained by expanding centerline average roughness, which is defined by JIS B 0601, into three dimensions so as to be applicable to a surface. Moreover, $R_a$ can be expressed as average value of the absolute values of deviations from a reference surface to a specific surface and is defined by Expression (1).

$$Ra = \frac{1}{S_0} \int_{y_1}^{y_2} \int_{x_1}^{x_2} |f(x, y) - Z_0| dx dy \qquad \text{[Expression 1]}$$

Note that in Expression (1), $S_0$ represents the area of a measurement surface (a rectangular region defined by four points represented by the coordinates $(x_1, y_1)$, $(x_1, y_2)$, $(x_2, y_1)$, and $(x_2, y_2)$), and $Z_0$ represents average height of the measurement surface. Further, $R_a$ can be measured with an atomic force microscope (AFM).

In the transistor illustrated in FIG. 1B, with the use of the gate electrode 110 as a mask, the low-resistance regions 106b (which serve as a source region and a drain region of the transistor) and the high-resistance region 106a (which serves as a channel region of the transistor) of the oxide semiconductor film 106 can be formed in a self-aligned manner. Thus, a minute transistor can be obtained. In addition, since a photolithography process for forming the low-resistance regions 106b and the high-resistance region 106a can be omitted, cost relating to the photolithography process is saved and yield is improved. Further, since there is substantially no overlap between the low-resistance region 106b and the gate electrode 110, parasitic capacitance caused by the low-resistance region 106b and the gate electrode 110 is not generated, so that the transistor can operate at high speed.

The transistor illustrated in FIG. 1B includes the sidewall insulating films 112; accordingly, when the transistor is in an on state, current flows from the pair of electrodes 114 to the high-resistance region 106a through the low-resistance regions 106b. The low-resistance regions 106b relax concentration of an electric field, so that deterioration such as hot carrier degradation can be suppressed even in a minute transistor with a short channel length, which can make the transistor highly reliable.

Note that in the transistor illustrated in FIGS. 1A and 1B, regions of the oxide semiconductor film 106 which overlap with the sidewall insulating films 112 are included in the low-resistance regions 106b; however, the present invention is not limited thereto. For example, the regions of the oxide semiconductor film 106 which overlap with the sidewall insulating films 112 may be included in the high-resistance region 106a. The above-described deterioration such as hot carrier degradation can be reduced also in the case of employing such a structure.

It is preferable that an insulating film from which oxygen is released by heat treatment be used as the base insulating film 102.

Further, for easier crystal growth in the oxide semiconductor film 106, it is preferable that the base insulating film 102 be sufficiently flat.

The base insulating film 102 may be formed to have a single-layer structure or a stacked-layer structure including at least one of silicon oxide, silicon oxynitride, silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

Silicon oxynitride contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. In addition, silicon nitride oxide contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are ranges for cases where measurement is performed using Rutherford backscattering spectrometry (RBS) or hydrogen forward scattering spectrometry (HFS). Moreover, the total of the percentages of the constituent elements does not exceed 100 atomic %.

To release oxygen by heat treatment means that the released amount of oxygen which is converted into oxygen atoms is estimated to be $1.0 \times 10^{18}$ atoms/cm$^{-3}$ or higher, specifically $3.0 \times 10^{20}$ atoms/cm$^{-3}$ or higher in thermal desorption spectroscopy (TDS) analysis.

Here, a method for measuring the amount of released oxygen using TDS analysis is described.

The total amount of released gases in TDS analysis is proportional to the integral value of intensity of ions of the released gases, and the total amount of released gases can be calculated by the comparison between the integral value of a measured sample and that of a standard sample.

For example, the number of released oxygen molecules ($N_{O2}$) from an insulating film can be found according to Expression (2) with the TDS analysis results of a silicon wafer containing hydrogen at a predetermined density which is the standard sample and the TDS analysis results of the insulating film. Here, all gases having a mass number of 32 which are obtained in the TDS analysis are assumed to originate from an oxygen molecule. CH$_3$OH, which is a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either, because the proportion of such a molecule in the natural world is minimal.

$$N_{O2} = \frac{N_{H2}}{S_{H2}} \times S_{O2} \times \alpha \qquad \text{[Expression 2]}$$

$N_{H2}$ is the value obtained by conversion of the number of hydrogen molecules released from the standard sample into densities. $S_{H2}$ is the integral value of ion intensity when the standard sample is subjected to TDS analysis. Here, the reference value of the standard sample is set to $N_{H2}/S_{H2}$. $S_{O2}$ is the integral value of ion intensity when the insulating film is subjected to TDS analysis. $\alpha$ is a coefficient affecting the ion intensity in the TDS analysis. Refer to Japanese Published Patent Application No. H6-275697 for details of Expression (2). Note that the amount of released oxygen from the above insulating film is measured with a thermal desorption spectroscopy apparatus produced by ESCO Ltd., EMD-WA1000S/W using a silicon wafer containing hydrogen atoms at $1 \times 10^{16}$ atoms/cm$^3$ as the standard sample.

Further, in the TDS analysis, part of oxygen is detected as an oxygen atom. The ratio between oxygen molecules and oxygen atoms can be calculated from the ionization rate of the oxygen molecules. Note that since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen converted into oxygen atoms is twice the number of the released oxygen molecules.

In the above structure, the film from which oxygen is released by heat treatment may be oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By supplying oxygen from the base insulating film 102 to the oxide semiconductor film 106, interface state density between the oxide semiconductor film 106 and the base insulating film 102 can be reduced. As a result, carrier trapping at the interface between the oxide semiconductor film 106 and the base insulating film 102 through operation of the transistor or the like can be suppressed, and thus a transistor whose electrical characteristics less deteriorate can be obtained.

Further, in some cases, electric charge is generated owing to oxygen deficiency in the oxide semiconductor film 106. In general, part of oxygen deficiency in an oxide semiconductor film serves as a donor and causes release of an electron which is a carrier. As a result, the threshold voltage of the transistor shifts in the negative direction. In view of this, when oxygen is sufficiently supplied from the base insulating film 102 to the oxide semiconductor film 106 and the oxide semiconductor film 106 preferably contains excess oxygen, oxygen deficiency in the oxide semiconductor film 106 which causes the negative shift of the threshold voltage can be reduced.

It is preferable that the protective insulating film 104 be a film through which oxygen does not pass even when heat treatment at a temperature higher than or equal to 250° C. and lower than or equal to 450° C., preferably higher than or equal to 150° C. and lower than or equal to 800° C. is performed for 1 hour, for example.

In the case where the protective insulating film 104 with such a property is provided in the periphery of the base insulating film 102, oxygen released from the base insulating film 102 by heat treatment can be inhibited from diffusing toward the outside of the transistor. Since oxygen is held in the base insulating film 102 in this manner, the field-effect mobility of the transistor can be prevented from decreasing, a variation in the threshold voltage can be reduced, and the reliability can be improved.

Note that a structure without the protective insulating film 104 can also be employed.

The protective insulating film 104 may be formed to have a single-layer structure or a stacked-layer structure including at least one of silicon nitride oxide, silicon nitride, aluminum oxide, aluminum nitride, hafnium oxide, zirconium oxide, yttrium oxide, lanthanum oxide, cesium oxide, tantalum oxide, and magnesium oxide.

A flexible substrate may be used as the substrate 100. As a method for forming a transistor on a flexible substrate, a method may be employed in which after the transistor is formed over a non-flexible substrate, the transistor is separated and transferred to the substrate 100 that is a flexible substrate. In that case, a separation layer is preferably provided between the non-flexible substrate and the transistor.

The gate electrode 110 may be formed to have a single-layer structure or a stacked-layer structure including at least one of the following materials: one of Al, Ti, Cr, Co, Ni, Cu, Y, Zr, Mo, Ag, Ta, and W; a nitride of any of these elements; an oxide of any of these elements; and an alloy of any of these elements. Alternatively, an oxide or an oxynitride which contains at least In and Zn may be used. For example, an In—Ga—Zn—O—N-based material can be used.

The gate insulating film 108 can be formed using a method and a material similar to those of the base insulating film 102.

The pair of electrodes 114 can be formed using a method and a material similar to those of the gate electrode 110.

The interlayer insulating film 116 can be formed using a method and a material similar to those of the base insulating film 102. It is also possible to stack a layer of a resin material (a polyimide resin, an acrylic resin, or the like) as part of the interlayer insulating film 116. Resin materials can be formed thick relatively easily and in the case of using a photosensitive resin, processing can be performed easily; thus, resin materials are suitable for the interlayer insulating film 116.

The wiring 118 can be formed using a method and a material similar to those of the gate electrode 110.

The field-effect mobility of a transistor will be described with reference to FIG. 25, FIGS. 26A to 26C, FIGS. 27A to 27C, and FIGS. 28A to 28C.

The field-effect mobility of a transistor tends to be measured lower than its inherent field-effect mobility for a variety of reasons; this phenomenon occurs not only in the case of using an oxide semiconductor. One of the causes for a reduction in the field-effect mobility is a defect inside a semiconductor or a defect at an interface between the semiconductor and an insulating film. Here, the field-effect mobility on the assumption that no defect exists inside the semiconductor is calculated theoretically by using a Levinson model.

Assuming that the inherent field-effect mobility of the transistor is $\mu_0$ and a potential barrier (such as a grain boundary) exists in the semiconductor, the measured field-effect mobility $\mu$ is expressed by Expression (3).

$$\mu = \mu_0 \exp\left(-\frac{E}{kT}\right) \quad \text{[Expression 3]}$$

Here, E represents the height of the potential barrier, k represents the Boltzmann constant, and T represents the absolute temperature. Note that according to the Levinson model, the height of the potential barrier E is assumed to be attributed to a defect and is expressed by Expression (4).

$$E = \frac{e^2 N^2}{8\varepsilon n} = \frac{e^3 N^2 t}{8\varepsilon C_{ox} V_{gs}} \quad \text{[Expression 4]}$$

Here, e represents the elementary charge, N represents the average defect density per unit area of a channel, $\varepsilon$ represents the dielectric constant of the semiconductor, n represents the carrier density per unit area of the channel, $C_{ox}$ represents the capacitance of the gate insulating film per unit area, $V_{gs}$ represents the gate voltage, and t represents the thickness of the channel. In the case where the thickness of the semiconductor layer is 30 nm or less, the thickness of the channel may be regarded as being the same as the thickness of the semiconductor layer.

The drain current $I_{ds}$ in a linear region is expressed by Expression (5).

$$\frac{I_{ds}}{V_{gs}} = \frac{W\mu V_{ds} C_{ox}}{L} \exp\left(-\frac{E}{kT}\right) \quad \text{[Expression 5]}$$

Here, L represents the channel length and W represents the channel width, and L and W are each set at 10 μm. In addition, $V_{ds}$ represents the drain voltage.

When taking logarithms of both sides of Expression (5), Expression (6) can be obtained.

$$\ln\left(\frac{I_{ds}}{V_{gs}}\right) = \quad \text{[Expression 6]}$$

-continued $$\ln\left(\frac{W\mu V_{ds} C_{ox}}{L}\right) - \frac{E}{kT} = \ln\left(\frac{W\mu V_{ds} C_{ox}}{L}\right) - \frac{e^3 N^2 t}{8kT\varepsilon C_{ox} V_{gs}}$$

Since the right side of Expression (6) is a function of $V_{gs}$, the defect density N can be obtained from the slope of a line showing a relation between $\ln(I_{ds}/V_{gs})$ indicated in the ordinate and $1/V_{gs}$ indicated in the abscissa. That is, the defect density N in the semiconductor can be obtained from the $V_{gs}$-$I_{ds}$ characteristics of the transistor.

Defect density N in a semiconductor depends on a substrate temperature in the formation of the semiconductor. In the case where the semiconductor is an oxide semiconductor deposited using an In—Sn—Zn—O target of In:Sn:Zn=1:1:1 [atomic ratio], the defect density N in the oxide semiconductor is approximately $1 \times 10^{12}/cm^2$.

Calculating with Expressions (3) and (4) on the basis of the above defect density N in the oxide semiconductor, the inherent field-effect mobility $\mu_0$ of the transistor comes to be 120 cm²/Vs. Thus, in an ideal transistor in which no defect exists inside the oxide semiconductor and at the interface between the oxide semiconductor and the gate insulating film that is in contact with the oxide semiconductor, the field-effect mobility $\mu_0$ is found to be 120 cm²/Vs. By contrast, in the case of using an oxide semiconductor with many defects, the field-effect mobility $\mu$ of a transistor is approximately 30 cm²/Vs.

Further, even when no defect exists inside the semiconductor, scattering at an interface between the channel and the gate insulating film adversely affects the transport properties of the transistor. The field-effect mobility $\mu_1$ at a position that is distance x away from the interface between the channel and the gate insulating film is expressed by Expression (7).

$$\frac{1}{\mu_1} = \frac{1}{\mu_0} + \frac{D}{B}\exp\left(-\frac{x}{l}\right) \quad \text{[Expression 7]}$$

Here, D represents the electric field intensity by the gate electrode, B represents a constant, and l represents the depth at which the adverse effect of scattering at the interface is caused. Values of B and l can be obtained from actual measurement of the electrical characteristics of the transistor; according to actual measurement of the electrical characteristics of the transistor including the above oxide semiconductor, B is $4.75 \times 10^7$ cm/s and l is 10 nm. As D is increased, i.e., as $V_{gs}$ is increased, the second term of Expression (7) increases and accordingly the field-effect mobility $\mu_1$ decreases.

Figure 25:
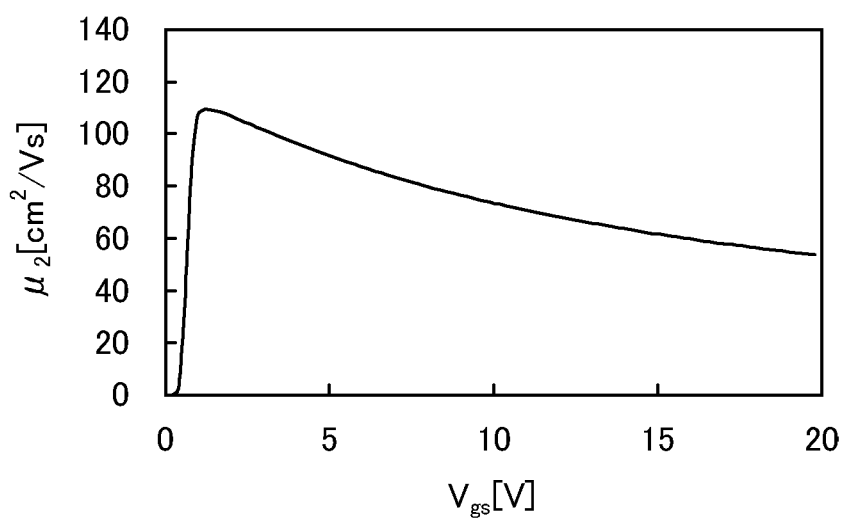
FIG. 25 shows $V_{gs}$ dependence of field-effect mobility obtained by calculation.

FIG. 25 shows calculation results of the field-effect mobility $\mu_2$ of an ideal transistor in which no defect exists inside an oxide semiconductor and at an interface between the oxide semiconductor and a gate insulating film that is in contact with the oxide semiconductor. For the calculation, Sentaurus Device manufactured by Synopsys, Inc. was used, and the band gap, the electron affinity, the relative permittivity, and the thickness of the oxide semiconductor were assumed to be 2.8 eV, 4.7 eV, 15, and 15 nm, respectively. Further, the work function of a gate of the transistor was assumed to be 5.5 eV and that of each of a source and a drain of the transistor was assumed to be 4.6 eV. The thickness of the gate insulating film was assumed to be 100 nm, and the relative permittivity thereof was assumed to be 4.1. The channel length and the channel width were each assumed to be 10 μm and $V_{ds}$ was assumed to be 0.1 V.

As shown in FIG. 25, the field-effect mobility $\mu_2$ has a peak of 100 cm$^2$/Vs or more at $V_{gs}$ of around 1 V, and then decreases as $V_{gs}$ becomes higher because the influence of interface scattering increases.

Calculation results in the case where such an ideal transistor is miniaturized are shown in FIGS. 26A to 26C, FIGS. 27A to 27C, and FIGS. 28A to 28C. Note that in the calculation, a transistor having the structure illustrated in FIG. 1B was assumed. Here, the resistivity of the low-resistance region 106b was assumed to be 2×10$^{-3}$ Ωcm, and the width of the gate electrode 110, that of the sidewall insulating film 112, and the channel width were assumed to be 33 nm, 5 nm, and 40 nm, respectively. Note that although the channel region is referred to as high-resistance region 106a for convenience, the channel region was assumed to be an intrinsic semiconductor here.

Figure 26A:
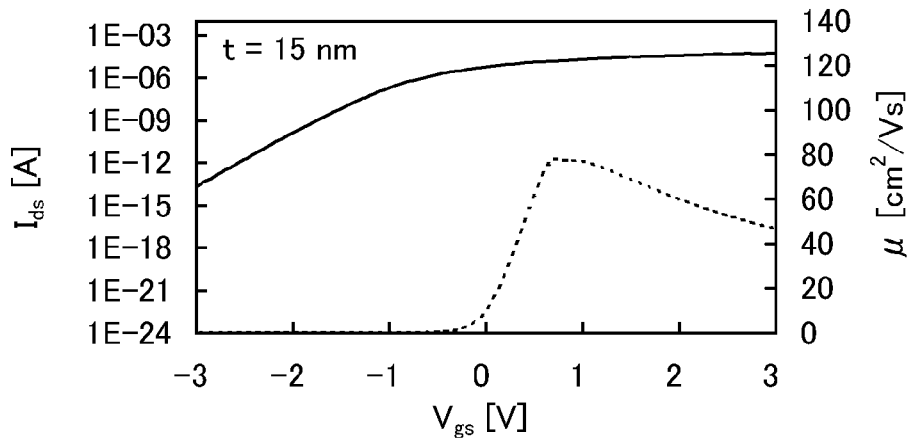
FIGS. 26A to 26C show $V_{gs}$ dependence of $I_{ds}$ and field-effect mobility obtained by calculation.
Figure 26B:
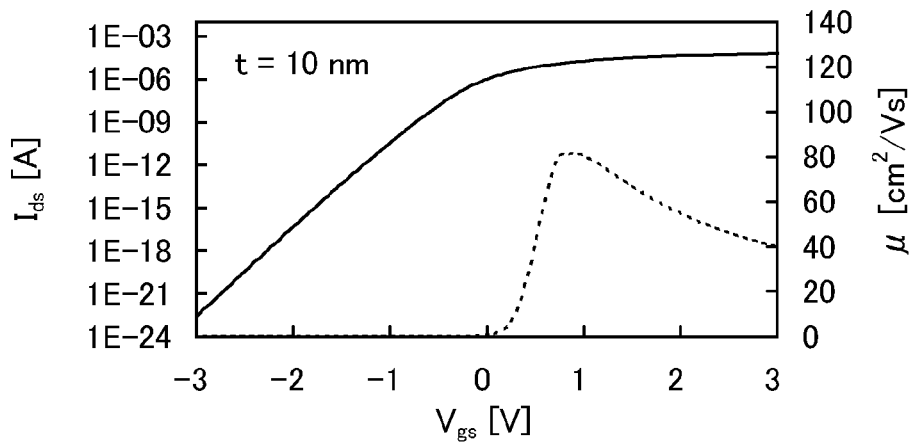
Figure 26C:
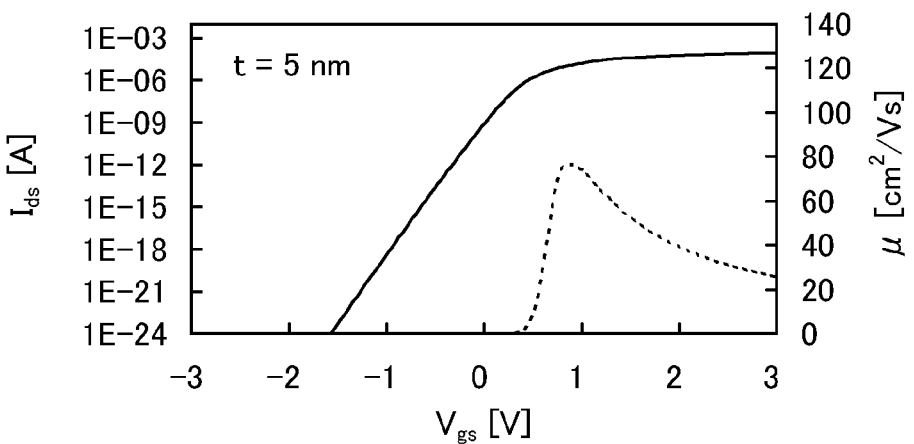

For the calculation, Sentaurus Device manufactured by Synopsys, Inc. was used. FIGS. 26A to 26C show $V_{gs}$ dependence of $I_{ds}$ (a solid line) and the field-effect mobility μ (a dotted line) of the transistor having the structure illustrated in FIG. 1B. Note that $I_{ds}$ was obtained in the condition in which $V_{ds}$ was 1 V and the field-effect mobility μ a was obtained in the condition in which $V_{ds}$ was 0.1 V. FIG. 26A shows the results where the thickness of the gate insulating film was 15 nm, FIG. 26B shows the results where the thickness of the gate insulating film was 10 nm, and FIG. 26C shows the results where the thickness of the gate insulating film was 5 nm.

FIGS. 26A to 26C show that as the gate insulating film is thinner, the drain current $I_{ds}$ in an off state (here, in the range of $V_{gs}$ from −3 V to 0 V) decreases. On the other hand, there is no noticeable change in the peak value of the field-effect mobility μ and the drain current $I_{ds}$ in an on state (here, in the range of $V_{gs}$ from 0 V to 3 V). FIGS. 26A to 26C show that $I_{ds}$ exceeds 10 μA, which is requisite for a memory and the like that are semiconductor devices, at $V_{gs}$ of around 1 V.

Similarly, the calculation was also conducted on a transistor which is different from the transistor illustrated in FIG. 1B in that the regions of the oxide semiconductor film 106 which overlap with the sidewall insulating films 112 are included in the high-resistance region 106a. The transistor is, in other words, a transistor having an offset region whose width is the same as the width of the sidewall insulating film 112. Note that the width of the offset region is also referred to as an offset length ($L_{off}$).

Figure 27A:
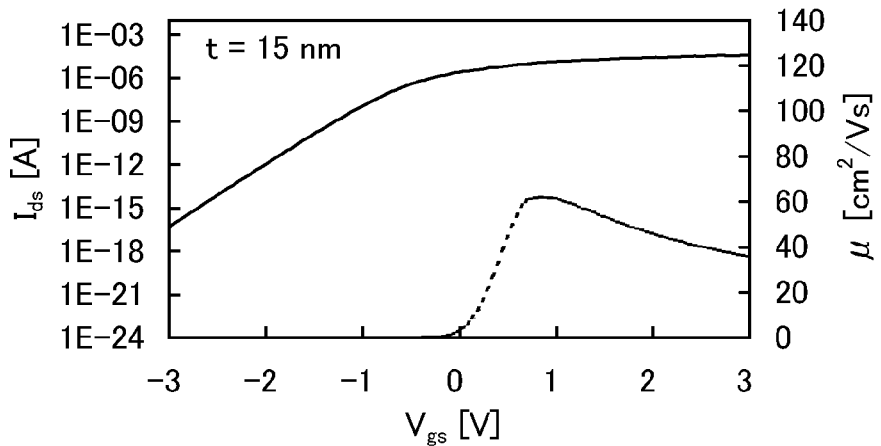
FIGS. 27A to 27C show $V_{gs}$ dependence of $I_{ds}$ and field-effect mobility obtained by calculation.
Figure 27B:
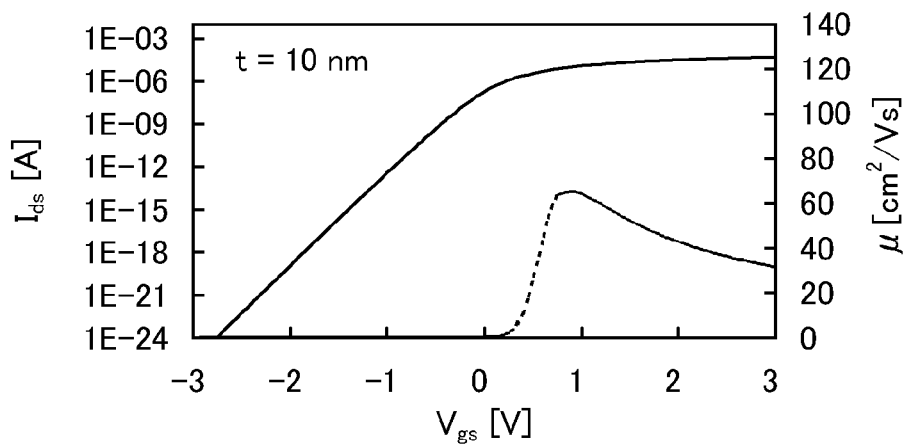
Figure 27C:
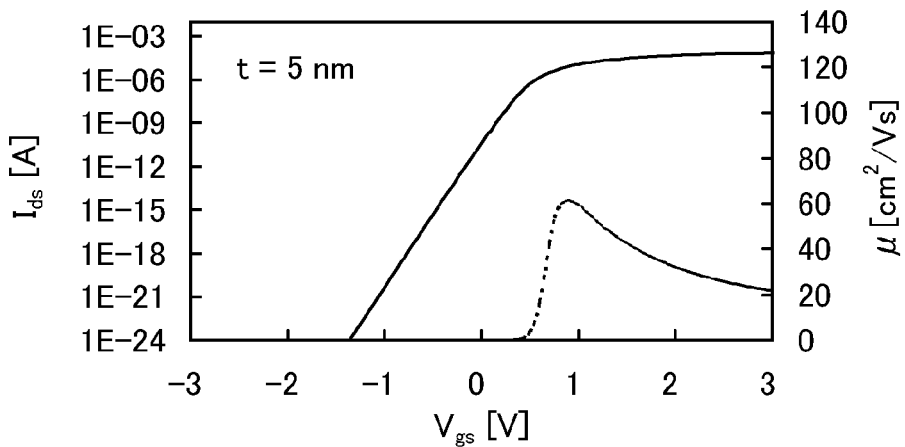

FIGS. 27A to 27C show $V_{gs}$ dependence of the drain current $I_{ds}$ (a solid line) and the field-effect mobility μ (a dotted line) of the transistor where the region of the oxide semiconductor film 106 which overlaps with the sidewall insulating film 112 is included in the high-resistance region 106a when $L_{off}$ is 5 nm Note that $I_{ds}$ is obtained in the condition in which $V_{ds}$ is 1 V and the field-effect mobility μ a is obtained in the condition in which $V_{ds}$ is 0.1 V. FIG. 27A shows the results where the thickness of the gate insulating film was 15 nm, FIG. 27B shows the results where the thickness of the gate insulating film was 10 nm, and FIG. 27C shows the results where the thickness of the gate insulating film was 5 nm.

Figure 28A:
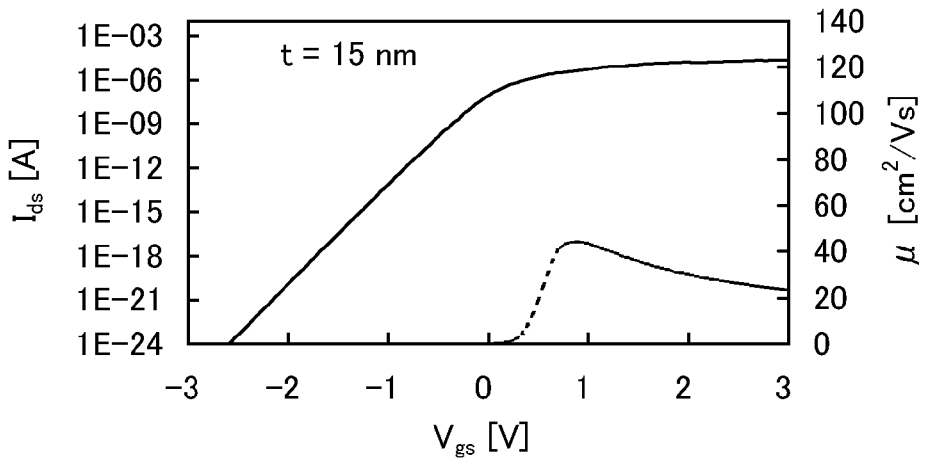
FIGS. 28A to 28C show $V_{gs}$ dependence of $I_{ds}$ and field-effect mobility obtained by calculation.
Figure 28B:
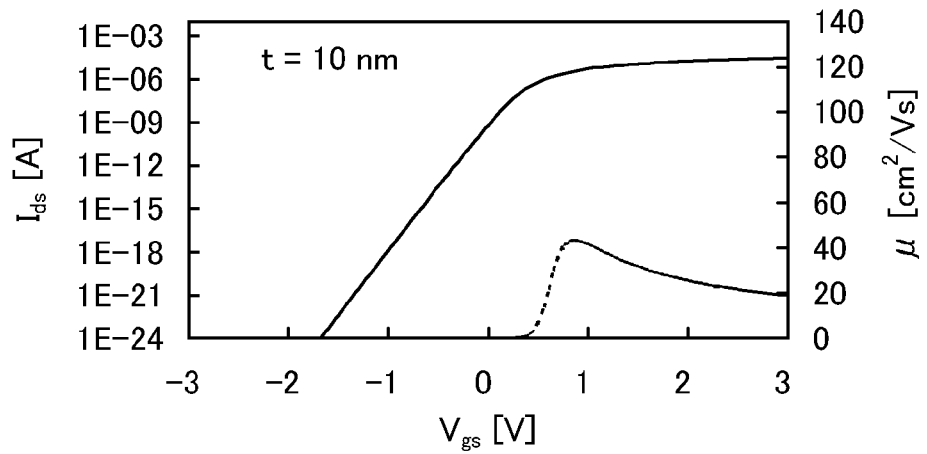
Figure 28C:
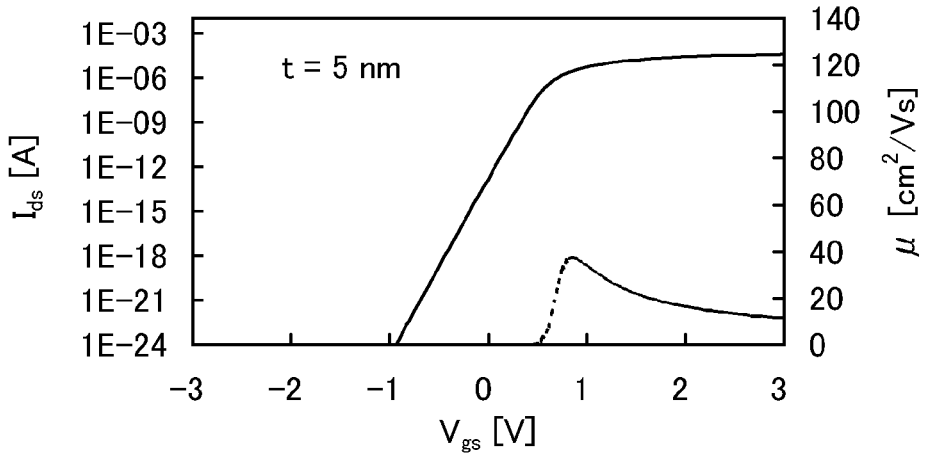

FIGS. 28A to 28C show $V_{gs}$ dependence of the drain current $I_{ds}$ (a solid line) and the field-effect mobility μ (a dotted line) of the transistor which is different from the structure illustrated in FIG. 1B in that the region of the oxide semiconductor film 106 which overlaps with the sidewall insulating film 112 is included in the high-resistance region 106a when $L_{off}$ is 15 nm Note that $I_{ds}$ is obtained in the condition in which $V_{ds}$ is 1 V and the field-effect mobility μ is obtained in the condition in which $V_{ds}$ is 0.1 V. FIG. 28A shows the results where the thickness of the gate insulating film was 15 nm, FIG. 28B shows the results where the thickness of the gate insulating film was 10 nm, and FIG. 28C shows the results where the thickness of the gate insulating film was 5 nm.

Both the calculation results in FIGS. 27A to 27C and those in FIGS. 28A to 28C show that similarly to FIGS. 26A to 26C, as the gate insulating film is thinner, the drain current $I_{ds}$ in an off state (here, in the range of $V_{gs}$ from −3 V to 0 V) decreases. On the other hand, it is also found that there is no noticeable change in the peak value of the field-effect mobility μ and the drain current $I_{ds}$ in an on state (here, in the range of $V_{gs}$ from 0 V to 3 V).

Note that the peak of the field-effect mobility μ is approximately 80 cm$^2$/Vs in FIGS. 26A to 26C, approximately 60 cm$^2$/Vs in FIGS. 27A to 27C, and approximately 40 cm$^2$/Vs in FIGS. 28A to 28C; thus, the peak of the field-effect mobility μ decreases as the offset length $L_{off}$ is increased. Further, it can be seen that the same applies to $I_{ds}$ in the off state. The drain current $I_{ds}$ in an on state also decreases as the offset length $L_{off}$ is increased, which is, however, much more gradual than the decrease in $I_{ds}$ in the off-state current. Any calculation result shows that $I_{ds}$ exceeds 10 μA, which is requisite for a memory and the like, at $V_{gs}$ of around 1 V.

An example of a method for manufacturing the transistor illustrated in FIG. 1B is described below.

Here, it is preferable that all the films be formed such that impurities such as hydrogen that adversely affect the characteristics of the transistor are not contained.

For example, impurities adhering to a surface of the substrate 100 are taken in a film in some cases. To avoid such a case, treatment for reducing impurities on the surface of the substrate 100 is preferably performed before the base insulating film 102 is formed. As the treatment for reducing impurities, plasma treatment, heat treatment, and chemical treatment are given.

Note that since impurities generated due to the inside of an apparatus for film formation (e.g., a film formation chamber) become a problem, such impurities are also preferably removed in advance. Specifically, the film formation chamber can be subjected to baking, whereby such impurities are released.

In addition, in the film formation chamber, approximately five-minute dummy film formation for approximately 100 dummy substrates is preferably performed in advance. Note that it is more preferable that the film formation chamber be evacuated every time dummy film formation for a dummy substrate is performed. Here, the dummy film formation refers to film formation on a dummy substrate by sputtering or the like, in which a film is formed on the dummy substrate and the inner wall of the film formation chamber so that impurities in the film formation chamber and an adsorbate on the inner wall of the film formation chamber are confined in the film. For the dummy substrate, a material from which a less amount of gas is released is preferably used, and for example, a material which is similar to that of the substrate 100 may be used. By performing dummy film formation, impurity concentration in a film to be formed can be reduced.

Note that baking and dummy film formation in a film formation chamber or the like are preferably performed at a temperature higher than that at the time of manufacture of the transistor. By setting a high temperature in advance, the amount of impurities that are released at a temperature lower than that temperature can be reduced.

Since the purity of a gas used for film formation also influences the impurity concentration in the film, a gas having a purity as high as possible is used. It is particularly preferable to use a gas containing less moisture. Specifically, a gas whose dew point is −70° C. or lower can be used. For example, an argon gas having a purity of 9N (dew point: −121° C., water concentration: 0.1 ppb, hydrogen concentration: 0.5 ppb) and an oxygen gas having a purity of 8N (dew point: −112° C., water concentration: 1 ppb, hydrogen concentration: 1 ppb) are more preferably used.

First, treatment for reducing impurities on a surface is performed on the substrate 100. After the treatment for reducing impurities, a base insulating film 152 is formed by a sputtering method, an evaporation method, a plasma chemical vapor deposition (PCVD) method, a pulsed laser deposition (PLD) method, an atomic layer deposition (ALD) method, a molecular beam epitaxy (MBE) method, or the like, without being exposed to the air (see FIG. 2A).

The base insulating film 152 is formed preferably by a sputtering method in an oxygen gas atmosphere at a substrate heating temperature higher than or equal to room temperature and lower than or equal to 200° C., preferably higher than or equal to 50° C. and lower than or equal to 150° C. Note that the oxygen gas to which a rare gas is added may be used. In that case, the percentage of an oxygen gas is 30 vol. % or more, preferably 50 vol. % or more, more preferably 80 vol. % or more. The thickness of the base insulating film 152 is greater than or equal to 100 nm and less than or equal to 1000 nm, preferably greater than or equal to 200 nm and less than or equal to 700 nm. Lower substrate heating temperature at the time of film formation, higher percentage of an oxygen gas in a film formation atmosphere, or a larger thickness of the base insulating film 152 leads to a larger amount of oxygen that is released at the time of performing heat treatment on the base insulating film 152. The concentration of hydrogen in a film can be more reduced by a sputtering method than a PCVD method. Note that the thickness of the base insulating film 152 is set such that the productivity is not reduced, although can be greater than 1000 nm.

Figure 2A:
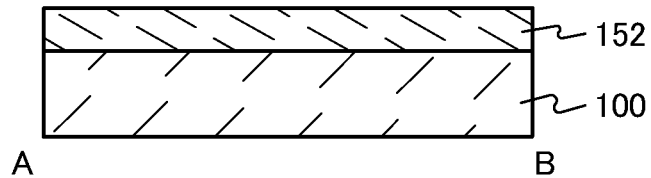
FIGS. 2A to 2F illustrate a method for manufacturing a transistor illustrated in FIGS. 1A and 1B.
Figure 2B:
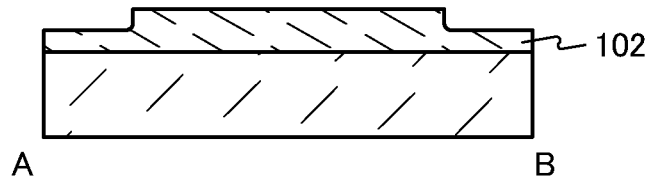

Then, the base insulating film 152 is processed by photolithography or the like, so that the base insulating film 102 is formed (see FIG. 2B).

Figure 2C:
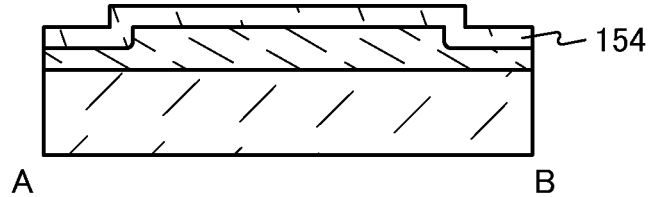

After that, a protective insulating film 154 is formed by a sputtering method, an evaporation method, a PCVD method, a PLD method, an ALD method, an MBE method, or the like (see FIG. 2C).

Figure 2D:
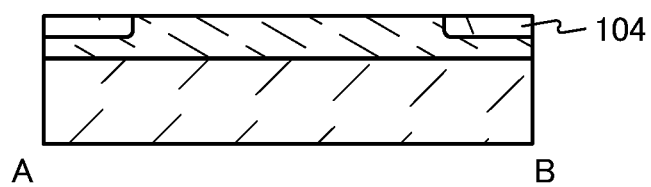

Then, by CMP treatment, the protective insulating film 104 whose surface is level with that of the base insulating film 102 is formed (see FIG. 2D). Note that the surface of the base insulating film 102 and that of the protective insulating film 104 may be substantially flush with each other. At this time, the CMP treatment may also serve as treatment for planarizing the base insulating film 102. Note that in addition to the planarization treatment by CMP treatment, planarization treatment by plasma treatment may be performed.

Figure 2E:
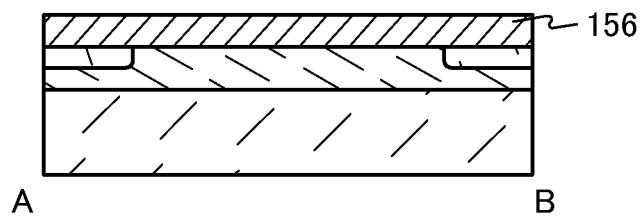

After that, an oxide semiconductor film 156 is formed by a sputtering method, an evaporation method, a PCVD method, a PLD method, an ALD method, an MBE method, or the like (see FIG. 2E).

The oxide semiconductor film 156 is formed preferably by a sputtering method in an oxygen gas atmosphere at a substrate heating temperature higher than or equal to 100° C. and lower than or equal to 600° C., preferably higher than or equal to 150° C. and lower than or equal to 550° C., and further preferably higher than or equal to 200° C. and lower than or equal to 500° C. The thickness of the oxide semiconductor film 156 is greater than or equal to 1 nm and less than or equal to 40 nm, preferably greater than or equal to 3 nm and less than or equal to 20 nm. As the substrate heating temperature at the time of film formation is higher, the impurity concentration of the obtained oxide semiconductor film 156 is lower. Further, the atomic arrangement in the oxide semiconductor film 156 is ordered, the density thereof is increased, so that a polycrystalline film or a CAAC-OS film is likely to be formed. Furthermore, since an oxygen gas atmosphere is employed for the film formation, an unnecessary atom such as a rare gas atom is not contained in the oxide semiconductor film 156, so that a polycrystalline film or a CAAC-OS film is likely to be formed. Note that a mixed gas atmosphere including an oxygen gas and a rare gas may be used. In that case, the percentage of an oxygen gas is 30 vol. % or more, preferably 50 vol. % or more, more preferably 80 vol. % or more. As the oxide semiconductor film 156 is thinner, the short channel effect of the transistor can be reduced. However, a too small thickness may increase the influence of the interface scattering and reduce the field effect mobility.

In the case of forming a film of an In—Sn—Zn—O-based material as the oxide semiconductor film 156 by a sputtering method, it is preferable to use an In—Sn—Zn—O target of In:Sn:Zn=2:1:3, 1:2:2, 1:1:1, or 20:45:35 [atomic ratio]. When the oxide semiconductor film 156 is formed using an In—Sn—Zn—O target having a composition ratio close to the aforementioned atomic ratio, a polycrystalline film or a CAAC-OS film is easily formed.

Next, first heat treatment is performed. The first heat treatment is performed in a reduced-pressure atmosphere, an inert atmosphere, or an oxidizing atmosphere. By the first heat treatment, the impurity concentration in the oxide semiconductor film 156 can be reduced.

The first heat treatment is preferably performed in such a manner that after heat treatment is performed in a reduced-pressure atmosphere or an inert atmosphere, the atmosphere is switched to an oxidation atmosphere with the temperature maintained and heat treatment is further performed. When the heat treatment is performed in a reduced-pressure atmosphere or an inert atmosphere, the impurity concentration in the oxide semiconductor film 156 can be effectively reduced; however, oxygen deficiencies are caused at the same time. By the heat treatment in the oxidation atmosphere, the caused oxygen deficiencies can be reduced.

By performing the first heat treatment in addition to the substrate heating at the time of film formation on the oxide semiconductor film 156, the impurity level density in the film can be significantly reduced. Accordingly, the field-effect mobility of the transistor can be increased so as to be close to ideal field-effect mobility to be described later.

The oxide semiconductor film 156 may be crystallized in the following manner: oxygen ions are implanted into the oxide semiconductor film 156, impurities such as hydrogen included in the oxide semiconductor film 156 are released by heat treatment, and the oxide semiconductor film 156 is crystallized through the heat treatment or by another heat treatment (first heat treatment or the like) performed later.

Further, in one embodiment of the present invention, the oxide semiconductor film 156 may be selectively crystallized not by the first heat treatment but by irradiation with a laser beam. Alternatively, it is also possible that the oxide semiconductor film 156 is selectively crystallized by irradiation with a laser beam while the first heat treatment is performed. Laser beam irradiation is performed in an inert atmosphere, an oxidizing atmosphere, or a reduced-pressure atmosphere. When laser beam irradiation is performed, a continuous wave (CW) laser beam or a pulsed laser beam can be used. For example, it is possible to use a gas laser beam such as an Ar laser beam, a Kr laser beam, or an excimer laser beam; a laser beam emitted using, as a medium, single crystal or polycrystalline YAG, YVO$_4$, forsterite (Mg$_2$SiO$_4$), YAlO$_3$, or GdVO$_4$ doped with one or more of Nd, Yb, Cr, Ti, Ho, Er, Tm, and Ta as a dopant; a solid-state laser beam such as a glass laser beam, a ruby laser beam, an alexandrite laser beam, or a Ti:sapphire laser beam; or a vapor laser beam emitted using one or both of copper vapor and gold vapor. By irradiation with the fundamental harmonic of such a laser beam or any of the second harmonic to the fifth harmonic of the fundamental harmonic of the laser beam, the oxide semiconductor film 156 can be crystallized. Note that it is preferable to use a laser beam having larger energy than a band gap of the oxide semiconductor film 156. For example, a laser beam emitted from a KrF, ArF, XeCl, or XeF excimer laser oscillator may be used. Note that the shape of the laser beam may be linear.

Note that laser beam irradiation may be performed plural times under different conditions. For example, it is preferable that first laser beam irradiation is performed in a rare gas atmosphere or a reduced-pressure atmosphere, and second laser beam irradiation is performed in an oxidizing atmosphere because in that case, high crystallinity can be obtained while oxygen deficiencies in the oxide semiconductor film 156 are reduced.

Figure 2F:
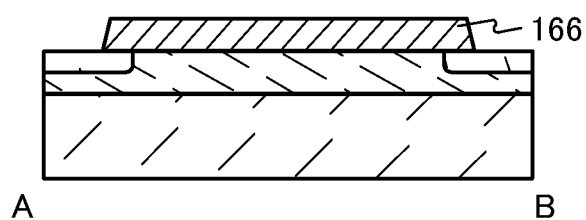

Then, the oxide semiconductor film 156 is processed by photolithography or the like, so that an oxide semiconductor film 166 is formed (see FIG. 2F).

Figure 3A:
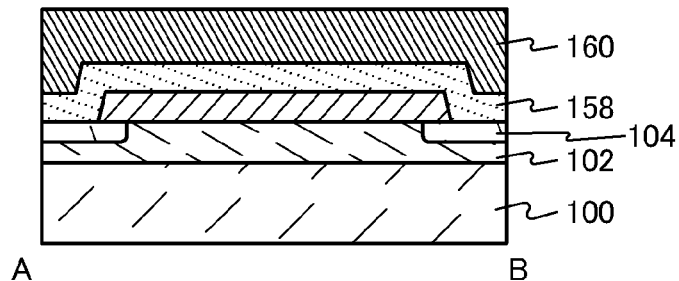
FIGS. 3A to 3D illustrate a method for manufacturing a transistor illustrated in FIGS. 1A and 1B.

After that, a gate insulating film 158 and a conductive film 160 are formed in this order (see FIG. 3A). As a method for forming these films, any of a sputtering method, an evaporation method, a PCVD method, a PLD method, an ALD method, an MBE method, and the like can be employed.

It is preferable that the gate insulating film 158 is formed in a manner similar to that of the base insulating film 152.

Figure 3B:
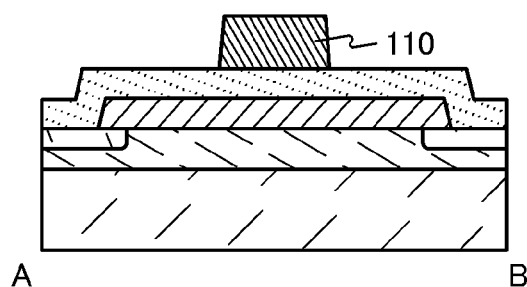

Then, the conductive film 160 is processed by photolithography or the like, so that the gate electrode 110 is formed (see FIG. 3B).

Figure 3C:
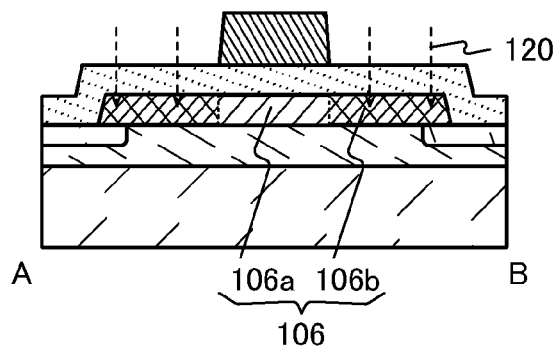

After that, with the use of the gate electrode 110 as a mask, an impurity 120 having a function of reducing a resistance value of the oxide semiconductor film 156 is added through the gate insulating film 158, so that the oxide semiconductor film 106 including the high-resistance region 106a and the low-resistance regions 106b is formed (see FIG. 3C). Note that phosphorus, nitrogen, boron, or the like can be used as the impurity 120. After addition of the impurity 120, heat treatment at a temperature higher than or equal to 250° C. and lower than or equal to 650° C. is performed. Note that the impurity 120 is preferably added by an ion implantation method because, in such a case, less hydrogen enters the oxide semiconductor film 106 as compared to the case where the impurity 120 is added by an ion doping method. Note that the use of an ion doping method is not excluded.

Note that by addition of the impurity 120 through the gate insulating film 158, damage caused at the time of addition of the impurity 120 to the oxide semiconductor film 106 can be reduced.

Figure 3D:
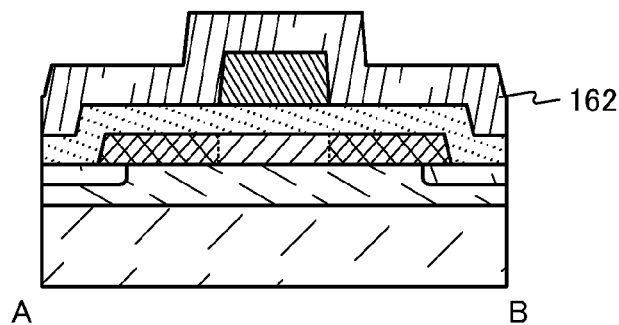

After that, an insulating film 162 is formed by a sputtering method, an evaporation method, a PCVD method, a PLD method, an ALD method, an MBE method, or the like (see FIG. 3D). The insulating film 162 may be formed by a method similar to that of the base insulating film 152.

Then, the insulating film 162 is etched, so that the sidewall insulating films 112 are formed. The etching here is a highly anisotropic etching step. The sidewall insulating films 112 can be formed in a self-aligned manner by performing the highly anisotropic etching step on the insulating film 162. For example, dry etching is preferably employed. As an etching gas used for dry etching, for example, a gas including fluorine such as trifluoromethane, octafluorocyclobutane, or tetrafluoromethane can be used. A rare gas or hydrogen may be added to the etching gas. As the dry etching, a reactive ion etching (RIE) method in which high-frequency voltage is applied to a substrate, is preferably used.

Figure 4A:
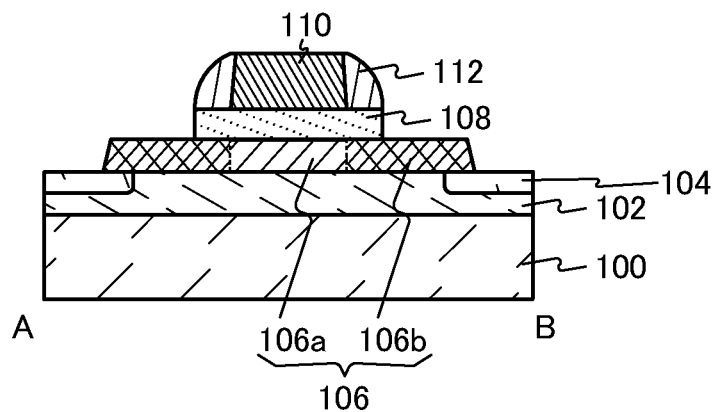
FIGS. 4A to 4C illustrate a method for manufacturing a transistor illustrated in FIGS. 1A and 1B.

After the sidewall insulating films 112 are formed, the gate insulating film 108 can be formed by processing the gate insulating film 158 (see FIG. 4A). Note that the gate insulating film 108 may be formed in the same step as the sidewall insulating films 112.

Note that instead of the steps that follow the step of forming the gate electrode 110, it is possible to add the impurity 120 to the oxide semiconductor film 166 with the use of the gate electrode 110 and the sidewall insulating films 112 as a mask (through the gate insulating film 158, in the case where the gate insulating film 108 has not been formed yet) after formation of the sidewall insulating films 112. In this manner, regions of the oxide semiconductor film 106 which overlap with the sidewall insulating films 112 can be included in the high-resistance region 106a.

Figure 4B:
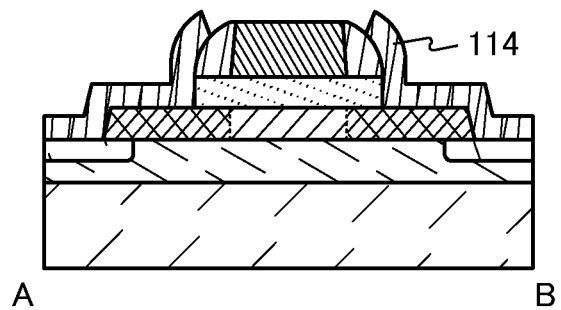

After that, a conductive film is formed by a sputtering method, an evaporation method, a PCVD method, a PLD method, an ALD method, an MBE method, or the like and processed by photolithography or the like, so that the pair of electrodes 114 are formed (see FIG. 4B).

Then, the interlayer insulating film 116 is formed by a sputtering method, an evaporation method, a PCVD method, a PLD method, an ALD method, an MBE method, or the like, and the opening portions for exposure of the pair of electrodes 114 are provided. Note that in the case where a layer of a resin material is stacked over the interlayer insulating film 116, the resin material can be additionally formed by a spin coating method, a slit coating method, or the like. A photosensitive material may be used as the resin material.

Figure 4C:
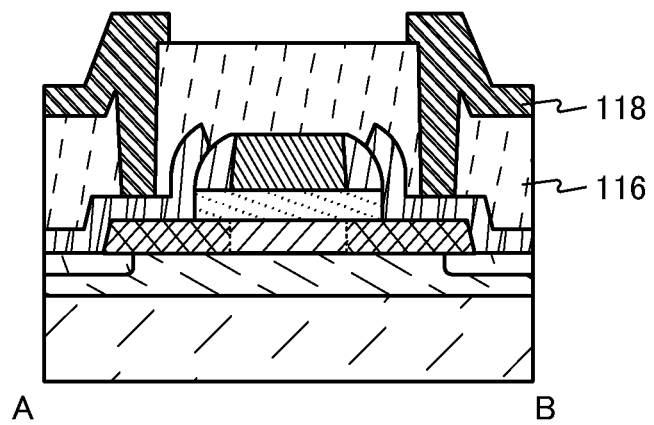

After that, a conductive film is formed by a sputtering method, an evaporation method, a PCVD method, a PLD method, an ALD method, an MBE method, or the like and processed by photolithography or the like, so that the wirings 118 which are in contact with the pair of electrodes 114 are formed (see FIG. 4C). Note that for the interlayer insulating film 116, it is preferable to use an aluminum oxide film at least part of which has a thickness of 20 nm or more, preferably 50 nm or more, more preferably 100 nm or more. When an aluminum oxide film is used, entry of impurities (e.g., hydrogen or water) from the outside of the transistor, which adversely affect the electrical characteristics of the transistor, can be suppressed. Further, outward diffusion of oxygen released from the base insulating film 102 from the transistor can be suppressed. To achieve these effects, although depending on the quality of the aluminum oxide film, the aluminum oxide film needs to have some thickness. However, making the thickness of the aluminum oxide film too large leads a reduction in productivity; thus, an appropriate thickness may be selected. Note that a silicon nitride film or a silicon nitride oxide film may be used instead of the aluminum oxide film.

Here, second heat treatment is performed. The second heat treatment can be performed after the interlayer insulating film 116 is formed and/or after the wirings 118 are formed. The second heat treatment is performed in a reduced-pressure atmosphere, an inert atmosphere, or an oxidizing atmosphere at a temperature higher than or equal to 150° C. and lower than or equal to 550° C., preferably higher than or equal to 250° C. and lower than or equal to 400° C. By the second heat treatment, oxygen is released from the base insulating film 102 and the gate insulating film 108, so that oxygen deficiency in the oxide semiconductor film 106 can be reduced. Moreover, interface state density between the base insulating film 102 and the oxide semiconductor film 106 and interface state density between the oxide semiconductor film 106 and the gate insulating film 108 can be reduced, whereby in the transistor, a variation in threshold voltage can be reduced and the reliability can be improved. Note that the heat treatment which is performed after the impurity 120 is added may be substituted for the second heat treatment.

In the case where a resin material is used for the interlayer insulating film 116, heat treatment performed on the resin material may serve as the second heat treatment.

Through the above-described steps, the transistor illustrated in FIG. 1B can be manufactured.

According to this embodiment, it is possible to provide a highly reliable transistor having high field-effect mobility and extremely low off-state current which includes an oxide semiconductor and in which a variation in threshold voltage is small.

Accordingly, since a transistor including an oxide semiconductor film which is described in this embodiment has low off-state current and high field-effect mobility, the transistor can be applied to a logic circuit in which a transistor needs to have high field-effect mobility.

This embodiment may be combined with any of the other embodiments.

Embodiment 2

In this embodiment, a transistor whose structure is different from the structure of the transistor in Embodiment 1 is described with reference to FIGS. 5A and 5B, FIGS. 6A to 6F, and FIGS. 7A to 7C.

Figure 5A:
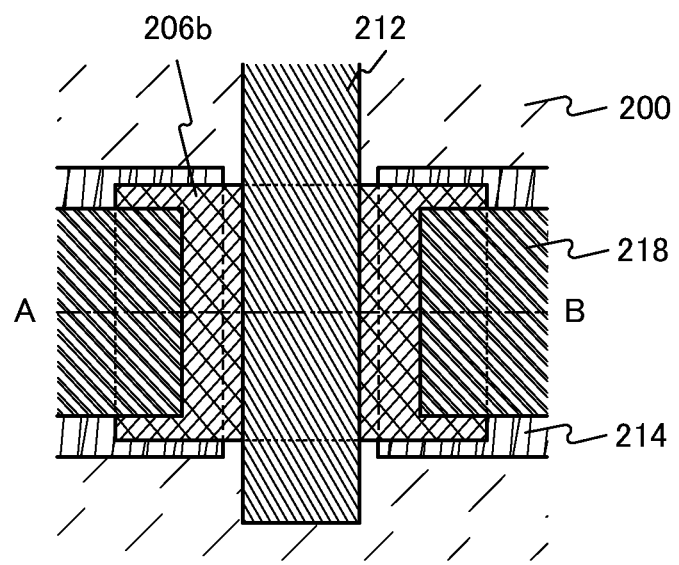
FIGS. 5A and 5B are a top view and a cross-sectional view of a transistor according to one embodiment of the present invention.
Figure 5B:
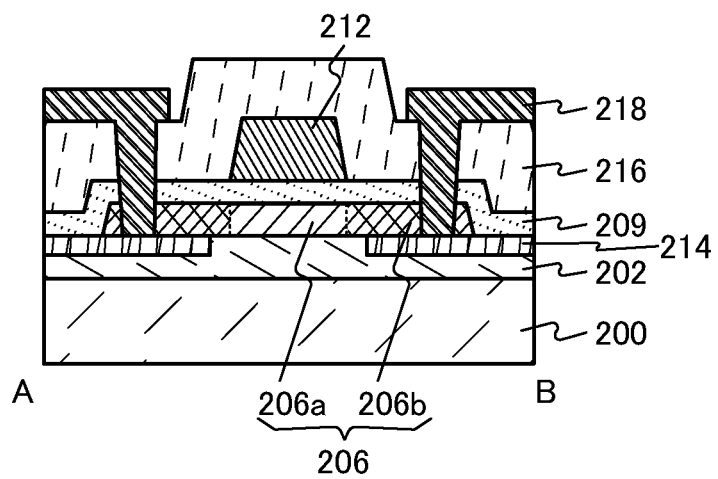

FIGS. 5A and 5B are a top view and a cross-sectional view of a transistor having a top-gate bottom-contact structure. FIG. 5A is the top view of the transistor. FIG. 5B shows a cross-section A-B along dashed-dotted line A-B in FIG. 5A.

The transistor illustrated in FIG. 5B includes a substrate 200, a base insulating film 202 provided over the substrate 200, a pair of electrodes 214 provided in groove portions of the base insulating film 202, an oxide semiconductor film 206 which includes a high-resistance region 206a and low-resistance regions 206b and which is provided over the base insulating film 202 and the pair of electrodes 214, a gate insulating film 208 provided over the oxide semiconductor film 206, a gate electrode 210 provided to overlap with the oxide semiconductor film 206 with the gate insulating film 208 provided therebetween, an interlayer insulating film 216 provided to cover the gate insulating film 208 and the gate electrode 210, and wirings 218 which are connected to the pair of electrodes 214 through opening portions provided in the interlayer insulating film 216, the gate insulating film 208, and the oxide semiconductor film 206. Although not illustrated, a protective film may be provided to cover the interlayer insulating film 216 and the wirings 218. With the protective film, a minute amount of leakage current generated by surface conduction of the interlayer insulating film 216 can be reduced.

Note that the substrate 200, the base insulating film 202, the oxide semiconductor film 206, the gate insulating film 208, the gate electrode 210, the pair of electrodes 214, the interlayer insulating film 216, and the wirings 218 can be respectively formed using materials and methods similar to those of the substrate 100, the base insulating film 102, the oxide semiconductor film 106, the gate insulating film 108, the gate electrode 110, the pair of electrodes 114, the interlayer insulating film 116, and the wirings 118.

The transistor illustrated in FIG. 5B is different from the transistor illustrated in FIG. 1B in that the pair of electrodes 214 are in contact with lower portions of the oxide semiconductor film 206. With this structure, part of the oxide semiconductor film 206 is not exposed to plasma or a chemical solution at the time of formation of the pair of electrodes 214. Therefore, this structure is preferable in the case where the oxide semiconductor film 206 is formed thin (e.g., in the case where the oxide semiconductor film 206 is formed to a thickness of 5 nm or less) or the like.

An example of a method for manufacturing the transistor illustrated in FIG. 5B is described below.

Figure 6A:
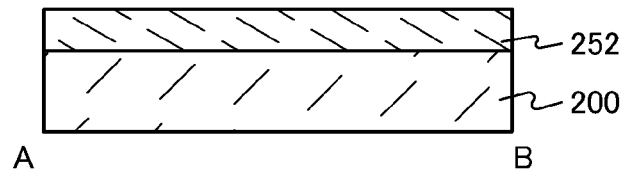
FIGS. 6A to 6F illustrate a method for manufacturing a transistor illustrated in FIGS. 5A and 5B.

First, a base insulating film 252 is formed over the substrate 200 (see FIG. 6A).

Figure 6B:
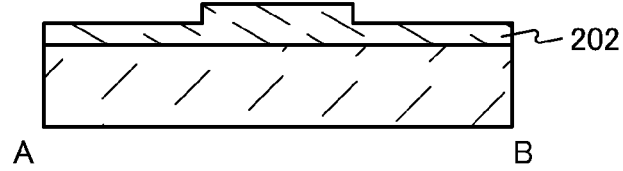

After that, the base insulating film 252 is processed, so that the base insulating film 202 is formed (see FIG. 6B).

Figure 6C:
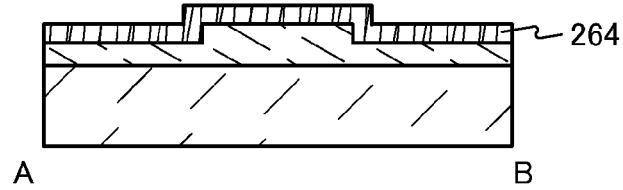

Then, a conductive film 264 is formed (see FIG. 6C).

Figure 6D:
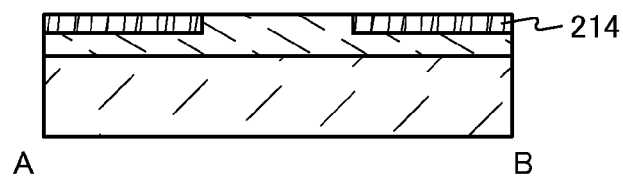

Then, CMP treatment is performed, so that the pair of electrodes 214 whose surfaces are flush with that of the base insulating film 202 are formed (see FIG. 6D).

Figure 6E:
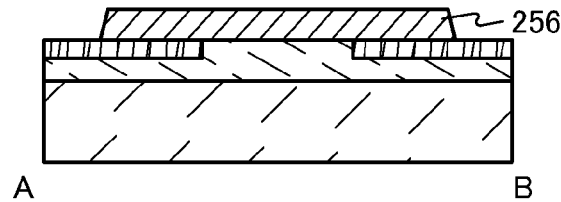

After that, an oxide semiconductor film 256 is formed (see FIG. 6E).

Next, the first heat treatment is performed. Embodiment 1 is to be referred to for details of the first heat treatment.

Figure 6F:
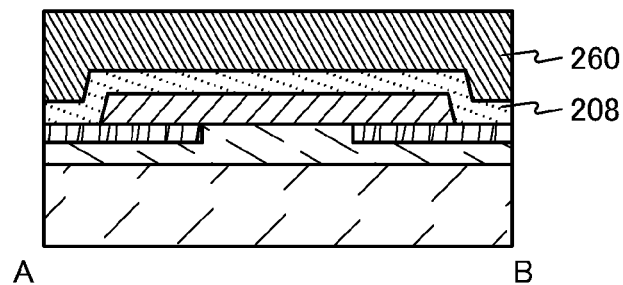

Then, the gate insulating film 208 and a conductive film 260 are formed in this order (see FIG. 6F).

Figure 7A:
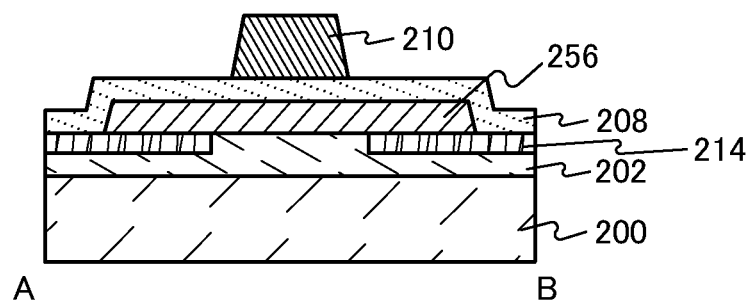
FIGS. 7A to 7C illustrate a method for manufacturing a transistor illustrated in FIGS. 5A and 5B.

Then, the conductive film 260 is processed, so that the gate electrode 210 is formed (see FIG. 7A).

Figure 7B:
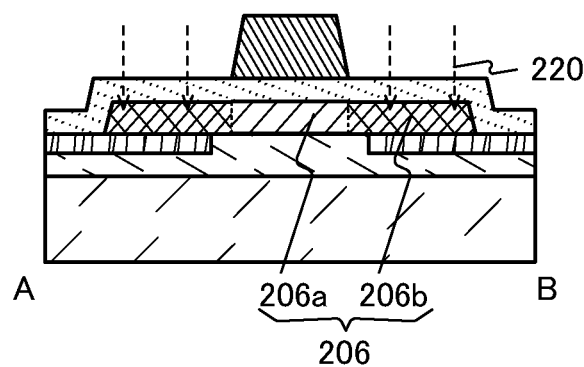
Figure 7C:
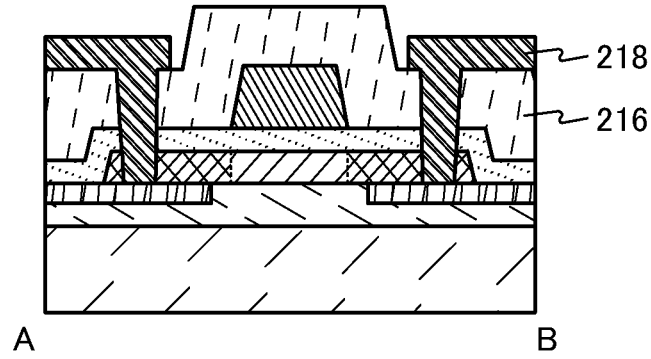

After that, with the use of the gate electrode 210 as a mask, an impurity 220 having a function of reducing a resistance value of the oxide semiconductor film 256 is added through the gate insulating film 208, so that the oxide semiconductor film 206 including the high-resistance region 206a and the low-resistance regions 206b is formed (see FIG. 7B). The description of the material of the impurity 120, the method for adding the impurity 120, and the subsequent heat treatment in Embodiment 1 is to be referred to for details of the impurity 220.

After that, the interlayer insulating film 216 is formed and the opening portions for exposure of the pair of electrodes 214 are provided. Then, a conductive film is formed and processed, so that the wirings 218 which are in contact with the pair of electrodes 214 are formed (see FIG. 7C).

Here, the second heat treatment is performed. Embodiment 1 is to be referred to for details of the second heat treatment.

Through the above-described steps, the transistor illustrated in FIG. 5B can be manufactured.

According to this embodiment, it is possible to provide a highly reliable transistor having high field-effect mobility and extremely low off-state current which includes an oxide semiconductor and in which a variation in threshold voltage is small.

This embodiment may be combined with any of the other embodiments.

Embodiment 3

In this embodiment, an example of manufacturing a memory that is a semiconductor device with the use of the transistor described in Embodiment 1 or 2 will be described.

Typical examples of volatile memories include a dynamic random access memory (DRAM) which stores data by selecting a transistor included in a memory element and storing electric charge in a capacitor and a static random access memory (SRAM) which holds stored data using a circuit such as a flip-flop.

The transistor described in Embodiment 1 or 2 can be applied to some of transistors included in the memory.

For example, an example of a DRAM that is a semiconductor device to which the transistor described in Embodiment 1 is applied is described with reference to FIGS. 8A to 8C.

Figure 8A:
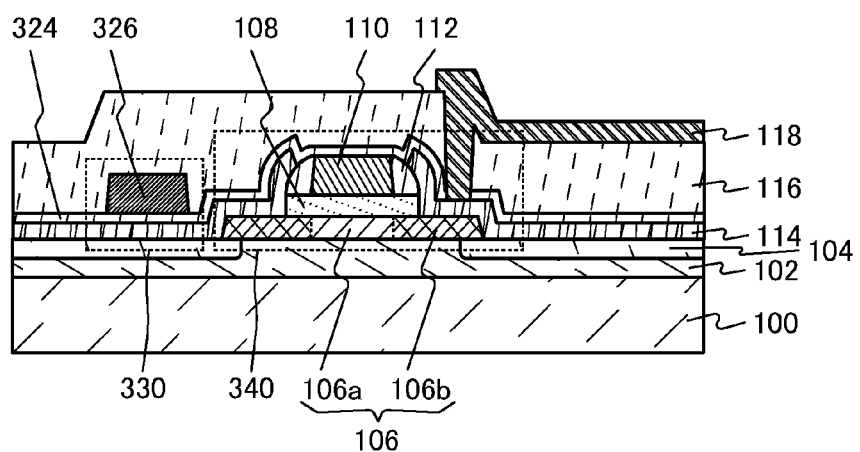
FIG. 8A is a cross-sectional view illustrating a method for manufacturing a semiconductor device according to one embodiment of the present invention.

FIG. 8A is a cross-sectional view of the DRAM. A transistor 340 includes the substrate 100, the base insulating film 102 provided over the substrate 100, the protective insulating film 104 provided in the periphery of the base insulating film 102, the oxide semiconductor film 106 which includes the high-resistance region 106a and the low-resistance regions 106b and which is provided over the base insulating film 102 and the protective insulating film 104, the gate insulating film 108 provided over the oxide semiconductor film 106, the gate electrode 110 provided to overlap with the high-resistance region 106a with the gate insulating film 108 provided therebetween, the sidewall insulating films 112 which are in contact with the side surfaces of the gate electrode 110, and the pair of electrodes 114 which are in contact with at least the low-resistance regions 106b and the sidewall insulating films 112. Note that in the high-resistance region 106a, a channel is formed when voltage higher than or equal to the threshold voltage of the transistor 340 is applied to the gate electrode 110.

The transistor 340 includes an interlayer insulating film 324 which is provided to cover the transistor 340 and an electrode 326 provided over the interlayer insulating film 324. A capacitor 330 is formed using one of the pair of electrodes 114, the interlayer insulating film 324, and the electrode 326. Note that although the capacitor in the drawing is a parallel-plate capacitor, a stack capacitor or a trench capacitor may be used for an increase in capacity.

Further, the transistor 340 includes the interlayer insulating film 116 which is provided to cover the interlayer insulating film 324 and the electrode 326 and the wiring 118 which is connected to the other of the pair of electrodes 114 through an opening portion provided in the interlayer insulating film 116 and the interlayer insulating film 324. Although not illustrated, a protective film may be provided to cover the interlayer insulating film 116 and the wiring 118. With the protective film, a minute amount of leakage current generated by surface conduction of the interlayer insulating film 116 can be reduced and thus the off-state current of the transistor can be reduced.

Figure 8B:
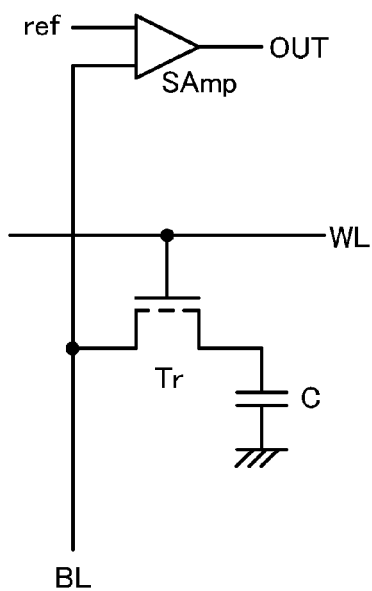
FIG. 8B is a circuit diagram of the semiconductor device.

FIG. 8B is a circuit diagram of the DRAM illustrated in FIG. 8A. The DRAM includes a bit line BL, a word line WL, a sense amplifier SAmp, a transistor Tr, and a capacitor C. Note that the transistor Tr corresponds to the transistor 340 and the capacitor C corresponds to the capacitor 330.

Figure 8C:
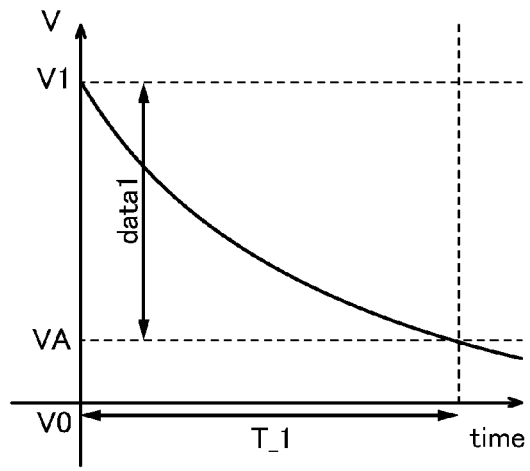
FIG. 8C shows electrical characteristics thereof.

It is known that the potential held by the capacitor C is gradually reduced over time due to the off-state current of the transistor Tr as shown in FIG. 8C. After a certain period of time, the potential originally charged from V0 to V1 is decreased to VA which is a limit for reading data 1. This period is called a holding period T_1. In the case of a two-level DRAM, refresh operation needs to be performed within the holding period T_1.

When the transistor 340 is employed as the transistor Tr, the holding period T_1 can be made longer because the off-state current of the transistor Tr can be made extremely low. That is, an interval between refresh operations can be extended; thus, power consumption of the DRAM can be reduced. In addition, the DRAM can operate at high speed owing to the high field-effect mobility of the transistor Tr.

For example, when a DRAM includes a transistor which includes a highly purified oxide semiconductor film and has an off-state current of $1\times10^{-18}$ A or lower, preferably $1\times10^{-21}$ A or lower, more preferably $1\times10^{-24}$ A or lower, an interval between refresh operations can be several seconds to several decades.

As described above, by applying the transistor according to one embodiment of the present invention to a DRAM, the DRAM can have high reliability and low power consumption and can operate at high speed.

Next, an example of a non-volatile memory that is a semiconductor device to which the transistor described in Embodiment 1 is applied is described with reference to FIGS. 9A to 9C.

Figure 9A:
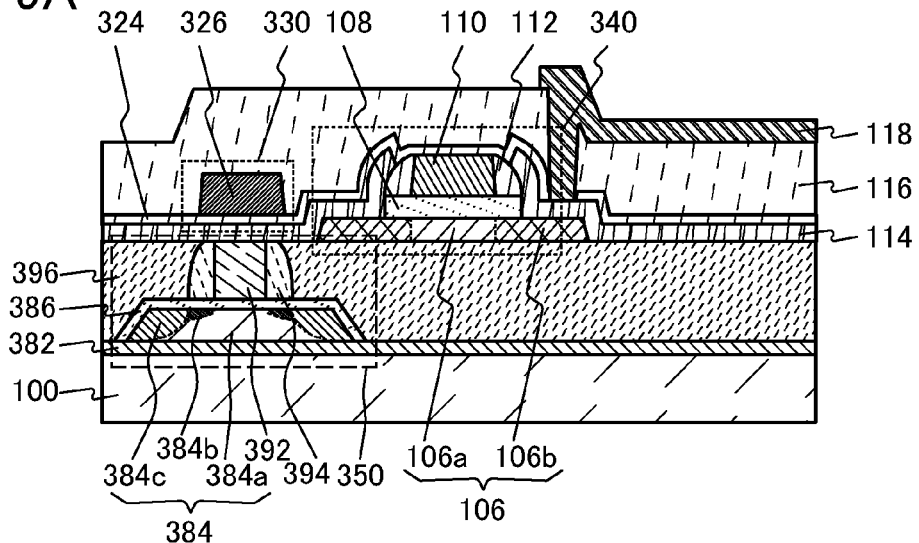
FIG. 9A is a cross-sectional view illustrating a method for manufacturing a semiconductor device according to one embodiment of the present invention.

FIG. 9A is a cross-sectional view of the non-volatile memory. A transistor 350 includes the substrate 100, a base insulating film 382 provided over the substrate 100, a semiconductor film 384 which includes a first resistance region 384a, second resistance regions 384b, and third resistance regions 384c and which is provided over the base insulating film 382, a gate insulating film 386 provided over the semiconductor film 384, a gate electrode 392 provided to overlap with the first resistance region 384a with the gate insulating film 386 provided therebetween, and sidewall insulating films 394 which are in contact with side surfaces of the gate electrode 392. In the semiconductor film 384, the third resistance region 384c has lower resistance than the second resistance region 384b, and the second resistance region 384b has lower resistance than the first resistance region 384a. Note that in the first resistance region 384a, a channel is formed when voltage higher than or equal to the threshold voltage of the transistor 350 is applied to the gate electrode 392. Although not illustrated, a pair of electrodes which are in contact with the third resistance regions 384c may be provided.

As the transistor 350, it is possible to use a transistor which includes a semiconductor film containing a Group 14 element other than an oxide semiconductor film (e.g., a polycrystalline silicon film, a single crystal silicon film, a polycrystalline germanium film, or a single crystal germanium film), or the transistor including an oxide semiconductor film described in Embodiment 1 or 2.

Further, an interlayer insulating film 396 is provided to be in contact with the transistor 350. Note that since the interlayer insulating film 396 has a surface on which the transistor 340 is formed, the surface of the interlayer insulating film 396 is made as flat as possible. Specifically, the surface of the interlayer insulating film 396 preferably has an $R_a$ of 1 nm or less, preferably 0.3 nm or less, more preferably 0.1 nm or less.

The interlayer insulating film 396 can have a single-layer structure or a stacked-layer structure; it is preferable that a layer of the interlayer insulating film 396 which is to be in contact with the oxide semiconductor film 106 be an insulating film from which oxygen is released by heat treatment.

The transistor 340 is provided over the interlayer insulating film 396. One of the pair of electrodes 114 of the transistor 340 is connected to the gate electrode 392 of the transistor 350. Further, the capacitor 330 is formed using one of the pair of electrodes 114 of the transistor 340, the interlayer insulating film 324, and the electrode 326. Note that although the capacitor in the drawing is a parallel-plate capacitor, a stack capacitor or a trench capacitor may be used for an increase in capacity.

Figure 9B:
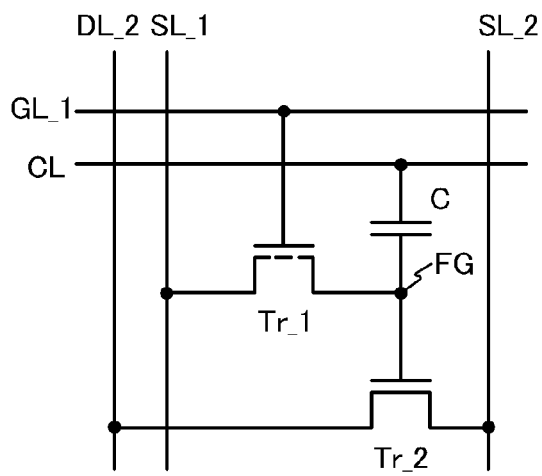
FIG. 9B is a circuit diagram of the semiconductor device.
Figure 9C:
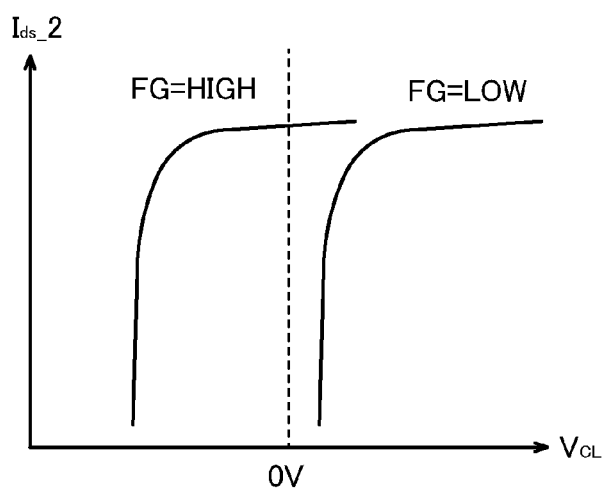
FIG. 9C shows electrical characteristics thereof.

FIG. 9B is a circuit diagram of the non-volatile memory illustrated in FIG. 9A. The non-volatile memory includes a transistor Tr_1, a gate line GL_1 connected to a gate of the transistor Tr_1, a source line SL_1 connected to a source of the transistor Tr_1, a transistor Tr_2, a source line SL_2 connected to a source of the transistor Tr_2, a drain line DL_2 connected to a drain of the transistor Tr_2, a capacitor C, a capacitor line CL connected to one terminal of the capacitor C, and a floating gate FG connected to the other terminal of the capacitor C, a drain of the transistor Tr_1, and a gate of the transistor Tr_2. Note that the transistor Tr_1 corresponds to the transistor 340, the transistor Tr_2 corresponds to the transistor 350, and the capacitor C corresponds to the capacitor 330.

The non-volatile memory described in this embodiment utilizes a variation in the apparent threshold voltage of the transistor Tr_2, which depends on the potential of the floating gate FG. For example, FIG. 9C is a graph showing a relation between a drain current $I_{ds\_2}$ flowing through the transistor Tr_2 and a potential $V_{CL}$ of the capacitor line CL.

The floating gate FG can control a potential through the transistor Tr_1. For example, the potential of the source line SL_1 is set to VDD. In this case, when the potential of the gate line GL_1 is set to be higher than or equal to the potential obtained by adding VDD to the threshold voltage Vth of the transistor Tr_1, the potential of the floating gate FG can be HIGH. Further, when the potential of the gate line GL_1 is set to be lower than or equal to the threshold voltage Vth of the transistor Tr_1, the potential of the floating gate FG can be LOW.

Thus, either a $V_{CL}$-$I_{ds\_2}$ curve (FG=LOW) or a $V_{CL}$-$I_{ds\_2}$ curve (FG=HIGH) can be obtained. In the case where FG=LOW, the drain current $I_{ds\_2}$ is low when $V_{CL}$ is 0 V, so that data 0 is given. In the case where FG=HIGH, the drain current $I_{ds\_2}$ is high when $V_{CL}$ is 0 V, so that data 1 is given. In such a manner, data can be stored.

By applying the transistor 340 to the transistor Tr_1, the off-state current of the transistor Tr_1 can be extremely low; thus, the electric charge stored in the floating gate FG which is illustrated in FIG. 9B can be inhibited from being unintentionally leaked through the transistor Tr_1. As a result, data can be held for a long time. In addition, the non-volatile memory can operate at high speed owing to the high field-effect mobility of the transistor Tr_1.

As described above, by applying the transistor according to one embodiment of the present invention to a non-volatile memory, the non-volatile memory can have high reliability for a long time and low power consumption and can operate at high speed.

This embodiment may be combined with any of the other embodiments.

Embodiment 4

A central processing unit (CPU) can be formed with the use of the transistor described in Embodiment 1 or 2 and the semiconductor device described in Embodiment 3 for at least part of the CPU.

Figure 10A:
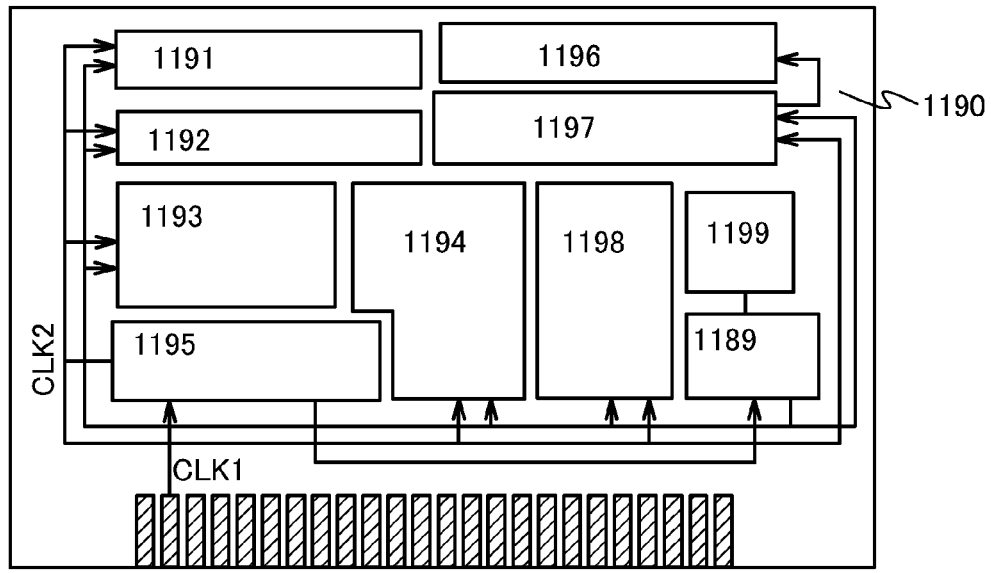
FIG. 10A is a block diagram showing a specific example of a CPU including a transistor according to one embodiment of the present invention and FIGS. 10B and 10C are circuit diagrams each illustrating part of the CPU.

FIG. 10A is a block diagram illustrating a specific structure of a CPU. The CPU illustrated in FIG. 10A includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 10A is only an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the clock signal CLK2 to the above circuits.

In the CPU illustrated in FIG. 10A, the semiconductor device described in Embodiment 3 is provided in the register 1196.

In the CPU illustrated in FIG. 10A, the register controller 1197 selects operation of holding data in the register 1196 in accordance with an instruction from the ALU 1191. That is, the register controller 1197 selects whether data is held by a phase-inversion element or a capacitor in the semiconductor device included in the register 1196. When data holding by the phase-inversion element is performed, power supply voltage is supplied to the semiconductor device in the register 1196. When data holding by the capacitor is performed, the data is rewritten in the capacitor, and supply of power supply voltage to the semiconductor device in the register 1196 can be stopped.

Figure 10B:
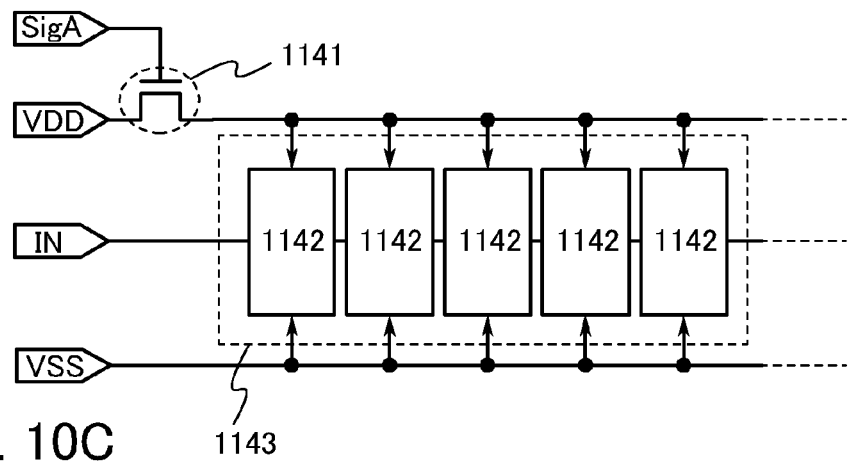
Figure 10C:
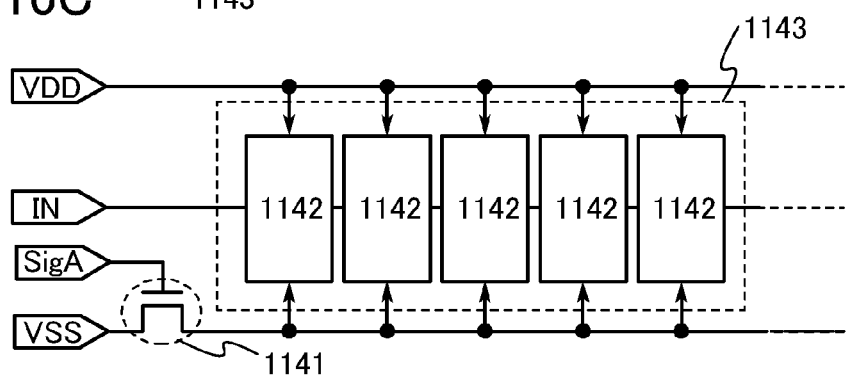

The power supply can be stopped by providing a switching element between a semiconductor device group and a node to which a power supply potential VDD or a power supply potential VSS is supplied, as illustrated in FIG. 10B or FIG. 10C. Circuits illustrated in FIGS. 10B and 10C will be described below.

FIGS. 10B and 10C each illustrate an example of a structure of a memory circuit including, as a switching element for controlling supply of a power supply potential to a semiconductor device, a transistor in which an oxide semiconductor is used for an active layer.

The memory device illustrated in FIG. 10B includes a switching element 1141 and a semiconductor device group 1143 including a plurality of semiconductor devices 1142. Specifically, as each of the semiconductor devices 1142, the semiconductor device described in Embodiment 3 can be used. Each of the semiconductor devices 1142 included in the semiconductor device group 1143 is supplied with the high-level power supply potential VDD via the switching element 1141. Further, each of the semiconductor devices 1142 included in the semiconductor device group 1143 is supplied with a potential of a signal IN and the low-level power supply potential VSS.

In FIG. 10B, as the switching element 1141, the transistor described in Embodiment 1 or 2 can be used. The switching of the transistor is controlled by a signal SigA supplied to a gate electrode thereof.

Note that FIG. 10B illustrates the structure in which the switching element 1141 includes only one transistor; however, without limitation thereto, the switching element 1141 may include a plurality of transistors. In the case where the switching element 1141 includes a plurality of transistors each serving as a switching element, the plurality of transistors may be connected to each other in parallel, in series, or in combination of parallel connection and series connection.

FIG. 10C illustrates an example of a memory device in which each of the semiconductor devices 1142 included in the semiconductor device group 1143 is supplied with the low-level power supply potential VSS via the switching element 1141. The supply of the low-level power supply potential VSS to each of the semiconductor devices 1142 included in the semiconductor device group 1143 can be controlled by the switching element 1141.

When a switching element is provided between a semiconductor device group and a node to which the power supply potential VDD or the power supply potential VSS is supplied, data can be held even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Further, when the transistor described in Embodiment 1 or 2 and the semiconductor device described in Embodiment 3 are used, the CPU can operate at high speed while consuming less power.

Although the CPU is given as an example, the transistor can also be applied to an LSI such as a digital signal processor (DSP), a custom LSI, or a field programmable gate array (FPGA).

This embodiment may be combined with any of the other embodiments.

Embodiment 5

In this embodiment, examples of electronic devices to which Embodiment 3 or 4 is applied will be described.

Figure 11A:
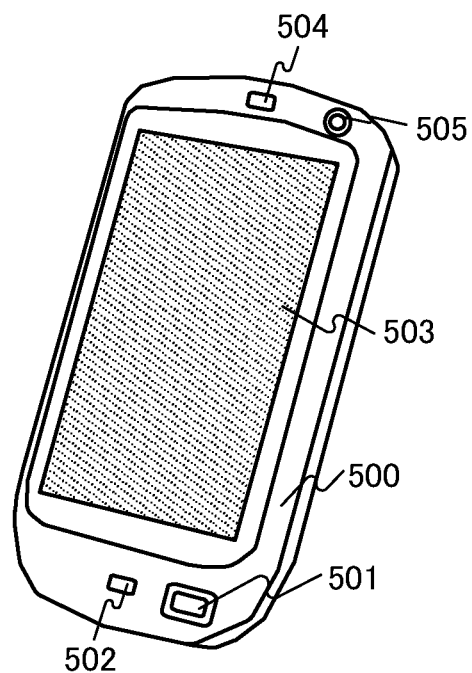
FIGS. 11A and 11B are perspective views each illustrating an example of an electronic device according to one embodiment of the present invention.

FIG. 11A illustrates a portable information terminal. The portable information terminal includes a housing 500, a button 501, a microphone 502, a display portion 503, a speaker 504, and a camera 505, and has a function as a mobile phone. Although not illustrated, the semiconductor device described in Embodiment 3 can be used as a memory of the portable information terminal, and the CPU described in Embodiment 4 can be used as a CPU of the portable information terminal.

Figure 11B:
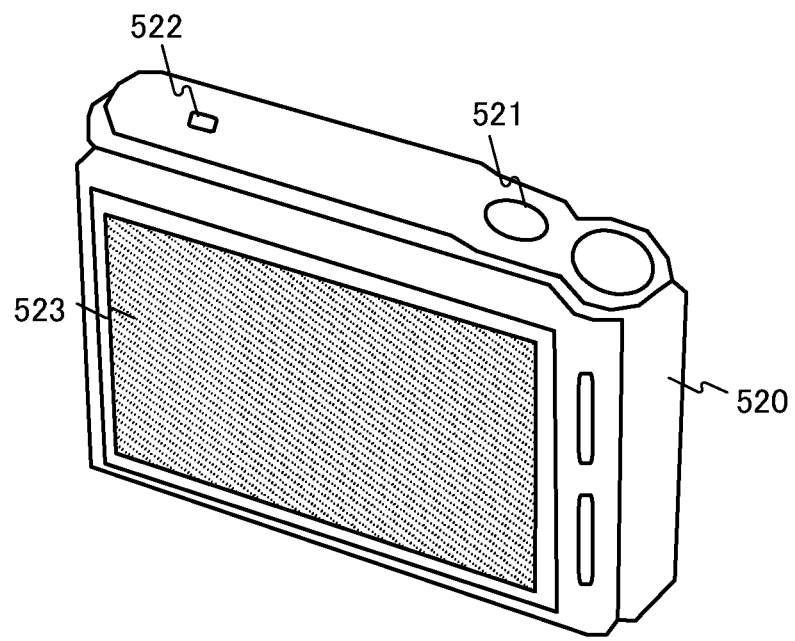

FIG. 11B illustrates a digital still camera. The digital still camera includes a housing 520, a button 521, a microphone 522, and a display portion 523. Although not illustrated, the semiconductor device described in Embodiment 3 can be used as a memory of the digital still camera.

A high-performance electronic device with high reliability can be obtained by using a transistor or a semiconductor device according to one embodiment of the present invention.

This embodiment can be implemented in appropriate combination with the other embodiments.

Example 1

In this example, a crystal state of an In—Sn—Zn—O film is described.

First of all, X-ray diffraction (XRD) analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

First, a quartz substrate that had been subjected to dehydrogenation treatment was prepared.

An In—Sn—Zn—O film with a thickness of 100 nm was formed over the quartz substrate.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at room temperature or 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for 1 hour and heat treatment in an oxygen atmosphere was further performed for 1 hour without lowering the temperature. A sample manufactured in this manner was used as Sample B.

Figure 19:
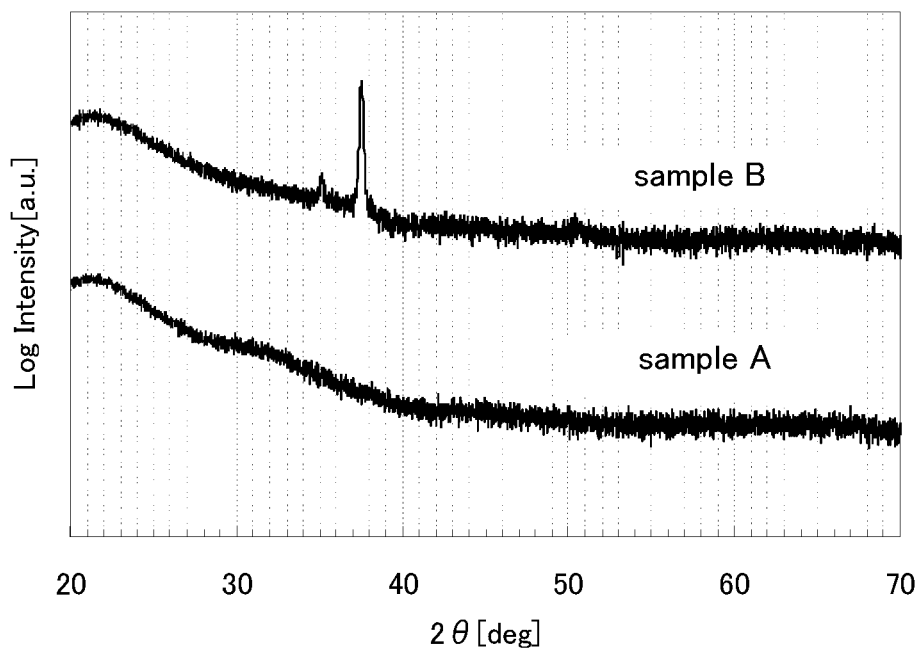
FIG. 19 shows XRD spectra of In—Sn—Zn—O films.

FIG. 19 shows XRD spectra of Sample A and Sample B. No peak derived from crystal was observed in Sample A, whereas peaks derived from crystal were observed when 2θ was around 35 deg and 37 deg to 38 deg in Sample B.

Figure 20:
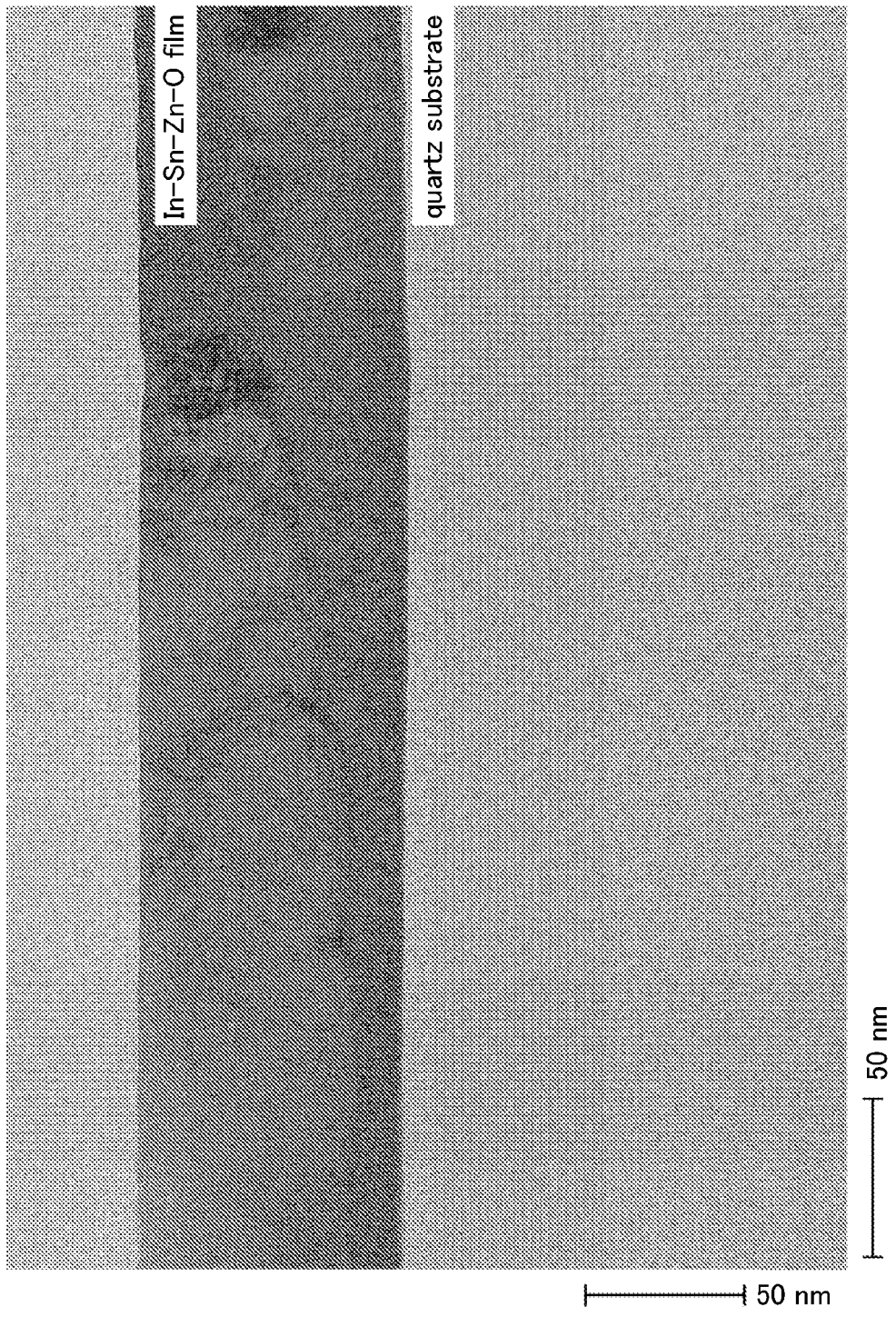
FIG. 20 is a cross-sectional TEM image of an In—Sn—Zn—O film.
Figure 21:
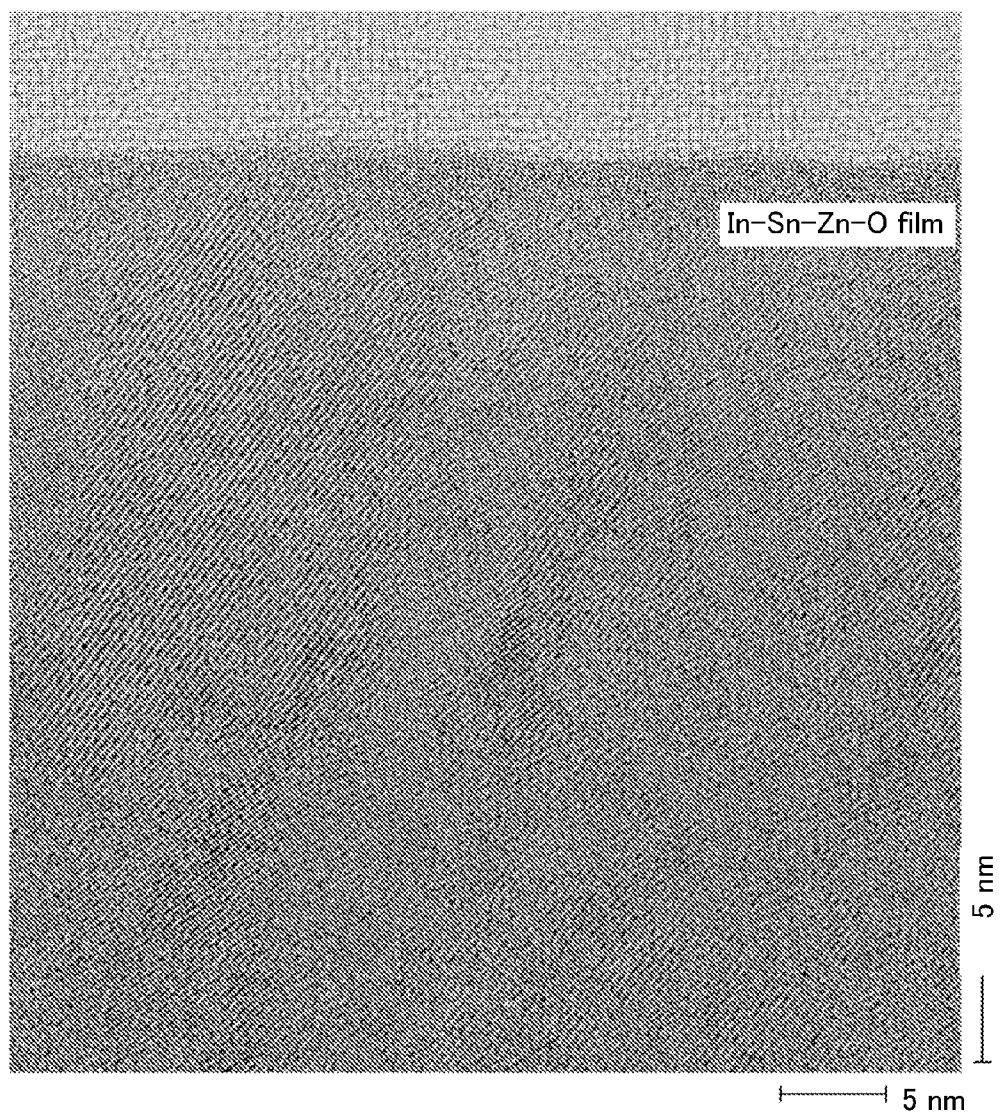
FIG. 21 is a cross-sectional TEM image of an In—Sn—Zn—O film.

FIG. 20 and FIG. 21 are cross-sectional images of Sample B which were obtained with a transmission electron microscope (TEM).

FIG. 20 is a cross-sectional TEM image at a magnification of 0.5 million times, and FIG. 21 is a cross-sectional TEM image at a magnification of 4 million times. Note that H-9000NAR manufactured by Hitachi, Ltd was used as the TEM, and the acceleration voltage was 300 kV.

As can be seen in FIG. 20 and FIG. 21, the In—Sn—Zn—O film of Sample B is polycrystalline, where crystals are oriented in various directions.

Example 2

In this example, electrical characteristics of a transistor in which an In—Sn—Zn—O film is used as an oxide semiconductor film are described.

Figure 12A:
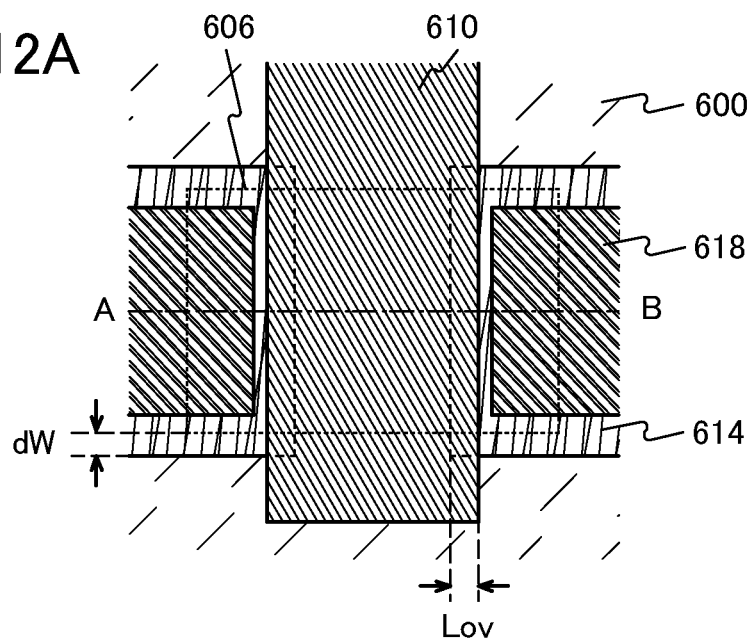
FIGS. 12A and 12B are a top view and a cross-sectional view which illustrate a structure of a transistor.
Figure 12B:
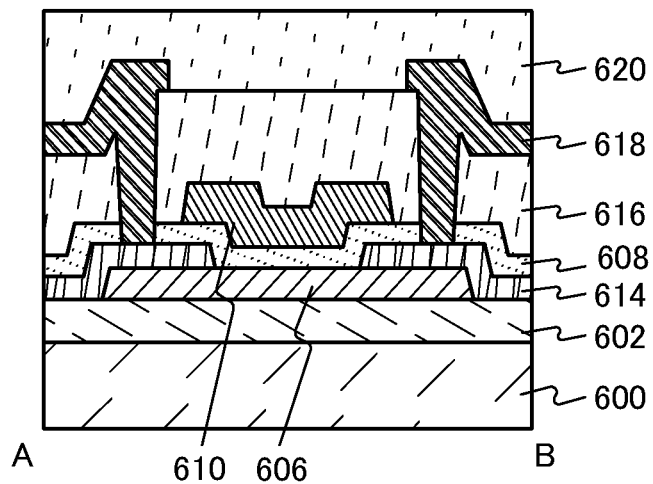

FIGS. 12A and 12B are a top view and a cross-sectional view of each of transistors which were manufactured in this example. FIG. 12A is a top view of each transistor. FIG. 12B is a cross-sectional view along dashed-dotted line A-B in FIG. 12A.

The transistor shown in FIG. 12B includes a substrate 600; a base insulating film 602 provided over the substrate 600; an oxide semiconductor film 606 provided over the base insulating film 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 provided therebetween; an interlayer insulating film 616 provided to cover the gate insulating film 608 and the gate electrode 610; wirings 618 connected to the pair of electrodes 614 through openings formed in the gate insulating film 608 and the interlayer insulating film 616; and a protective film 620 provided to cover the interlayer insulating film 616 and the wirings 618.

A glass substrate was used as the substrate 600. A silicon oxide film was used as the base insulating film 602. An In—Sn—Zn—O film was used as the oxide semiconductor film 606. A tungsten film was used as the pair of electrodes 614. A silicon oxide film was used as the gate insulating film 608. A stacked-layer structure of a tantalum nitride film and a tungsten film was used for the gate electrode 610. A stacked-layer structure of a silicon oxynitride film and a polyimide film was used for the interlayer insulating film 616. A stacked-layer structure in which a titanium film, an aluminum film, and a titanium film are stacked in this order was used for each of the wirings 618. A polyimide film was used as the protective film 620.

In the transistor having the structure shown in FIG. 12A, the width of a portion where the gate electrode 610 overlaps with the electrode 614 is referred to as Lov. In addition, the width of a portion of the electrode 614 which does not overlap with the oxide semiconductor film 606 is referred to as dW.

A method for forming the transistor having the structure shown in FIG. 12B is described below.

First, plasma treatment was performed on a surface of the substrate 600 in an argon atmosphere. The plasma treatment was carried out with a sputtering apparatus by applying a bias power of 200 W (RF) to the substrate 600 side for 3 minutes.

Subsequently, without breaking the vacuum, the silicon oxide film as the base insulating film 602 was formed to have a thickness of 300 nm.

The silicon oxide film was formed with a sputtering apparatus with a power of 1500 W (RF) in an oxygen atmosphere. A quartz target was used as a target. The substrate heating temperature in the film deposition was set at 100° C.

Next, a surface of the base insulating film 602 was processed by CMP to be planarized such that $R_a$ was about 0.2 nm.

Next, the In—Sn—Zn—O film as an oxide semiconductor film was formed to have a thickness of 15 nm.

The In—Sn—Zn—O film was formed with a sputtering apparatus with a power of 100 W (DC) in a mixed atmosphere of argon:oxygen=2:3 [volume ratio]. An In—Sn—Zn—O target of In:Sn:Zn=1:1:1 [atomic ratio] was used as a target. The substrate heating temperature in the film deposition was set at 200° C.

Next, heat treatment was performed at 250° C., 450° C., or 650° C. As the heat treatment, heat treatment in a nitrogen atmosphere was first performed for 1 hour and then heat treatment in an oxygen atmosphere was performed for 1 hour while keeping the temperature.

Next, the oxide semiconductor film was processed by a photolithography process, so that the oxide semiconductor film 606 was formed.

Next, the tungsten film was formed to have a thickness of 50 nm.

The tungsten film was formed with a sputtering apparatus with a power of 1000 W (DC) in an argon atmosphere. The substrate heating temperature in the film deposition was set at 200° C.

Next, the tungsten film was processed by a photolithography process, so that the pair of electrodes 614 were formed.

Next, the silicon oxide film as the gate insulating film 608 was formed to have a thickness of 100 nm. The relative permittivity of the silicon oxide film was set at 3.8.

The silicon oxide film as the gate insulating film 608 was formed in a similar manner to the base insulating film 602.

Next, the tantalum nitride film and the tungsten film were formed in this order to have thicknesses of 15 nm and 135 nm, respectively.

The tantalum nitride film was formed with a sputtering apparatus with a power of 1000 W (DC) in a mixed atmosphere of argon:nitrogen=5:1. Substrate heating was not performed in the film deposition.

The tungsten film was formed with a sputtering apparatus with a power of 4000 W (DC) in an argon atmosphere. The substrate heating temperature in the film deposition was set at 200° C.

Next, the tantalum nitride film and the tungsten film were processed by a photolithography process, so that the gate electrode 610 was formed.

Next, the silicon oxynitride film as part of the interlayer insulating film 616 was formed to have a thickness of 300 nm.

The silicon oxynitride film as part of the interlayer insulating film 616 was formed with a PCVD apparatus with a power of 35 W (RF) in a mixed atmosphere of monosilane:nitrous oxide=1:200. The substrate heating temperature in the film deposition was set at 325° C.

Next, the silicon oxynitride film as part of the interlayer insulating film 616 was processed by a photolithography process.

Next, photosensitive polyimide as part of the interlayer insulating film 616 was deposited to have a thickness of 1500 nm.

Next, the photosensitive polyimide as part of the interlayer insulating film 616 was exposed to light using a photomask which was used in the photolithography process on the silicon oxynitride film as part of the interlayer insulating film 616, and developed, and subjected to heat treatment for hardening the photosensitive polyimide film. In this manner, the interlayer insulating film 616 was formed of the silicon oxynitride film and the photosensitive polyimide film. The heat treatment was performed in a nitrogen atmosphere at 300° C.

Next, the titanium film, the aluminum film, and the titanium film were formed in this order to have thicknesses of 50 nm, 100 nm, and 5 nm, respectively.

The two titanium films were formed with a sputtering apparatus with a power of 1000 W (DC) in an argon atmosphere. Substrate heating was not performed in the film deposition.

The aluminum film was formed with a sputtering apparatus with a power of 1000 W (DC) in an argon atmosphere. Substrate heating was not performed in the film deposition.

Next, the titanium film, the aluminum film, and the titanium film were processed by a photolithography process, so that the wirings 618 were formed.

Next, a photosensitive polyimide film as the protective film 620 was formed to have a thickness of 1500 nm.

Next, the photosensitive polyimide film was exposed to light with the use of a photomask which was used in the photolithography process on the wirings 618, and developed, so that openings at which the wirings 618 are exposed were formed in the protective film 620.

Next, heat treatment for hardening the photosensitive polyimide film was performed thereon. The heat treatment was performed in a similar manner to the heat treatment performed on the photosensitive polyimide film as the interlayer insulating film 616.

Through the above process, the transistor having the structure shown in FIG. 12B was formed.

Next, electrical characteristics of the transistor having the structure shown in FIG. 12B were evaluated.

Here, $V_{gs}$-$I_{ds}$ characteristics of the transistor having the structure described in this example were measured; the results are shown in FIGS. 13A and 13B and FIGS. 14A and 14B. Each transistor used for the measurement has a channel length L of 3 µm, a channel width W of 10 µm, Lov of 3 µm per side (6 µm in total), and dW of 3 µm per side (6 µm in total). Note that $V_{ds}$ was set at 10 V.

FIGS. 13A and 13B and FIGS. 14A and 14B each show the $V_{gs}$ dependence of $I_{ds}$ (a solid line) and field-effect mobility (a dotted line) of the transistor.

Here, the samples are different in condition of heat treatment performed after formation of the oxide semiconductor film 606. In Sample 1, the heat treatment was not performed.

Note that Sample 2, Sample 3, and Sample 4 were subjected to heat treatment at 250° C., 450° C., and 650° C., respectively.

Figure 13A:
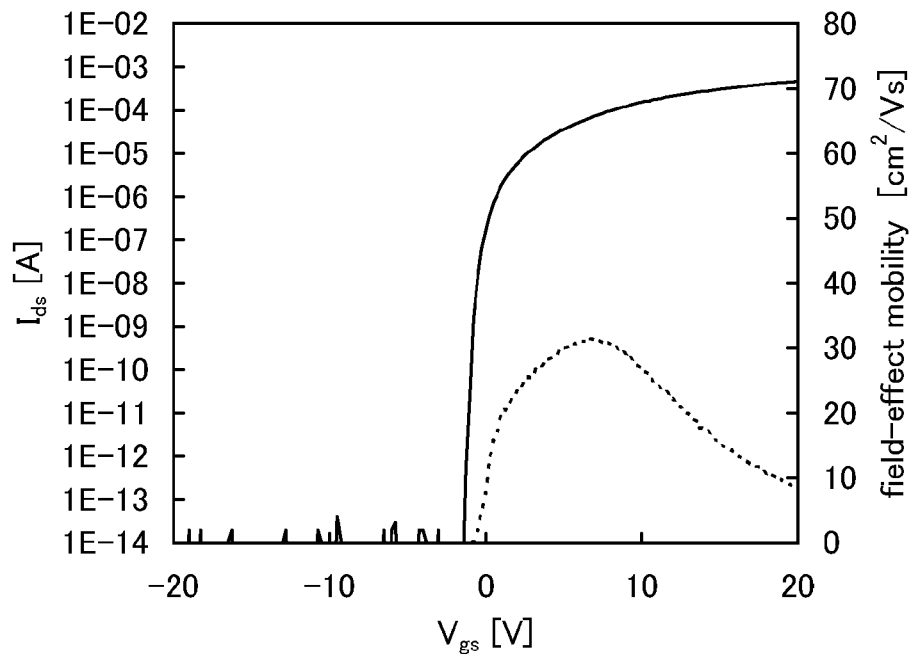
FIGS. 13A and 13B show $V_{gs}$-$I_{ds}$ characteristics and field-effect mobility of transistors of Samples 1 and 2.
Figure 13B:
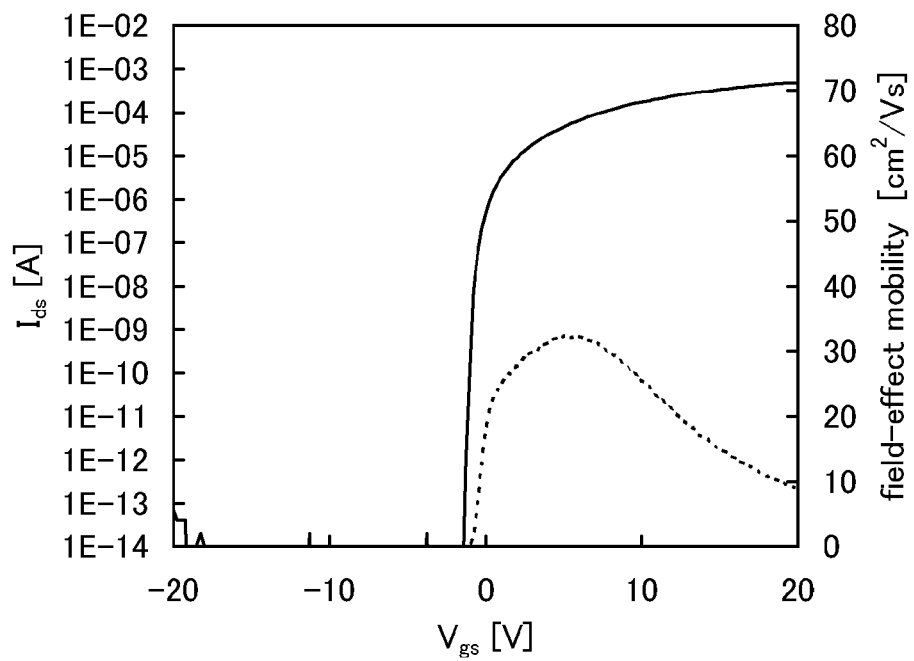
Figure 14A:
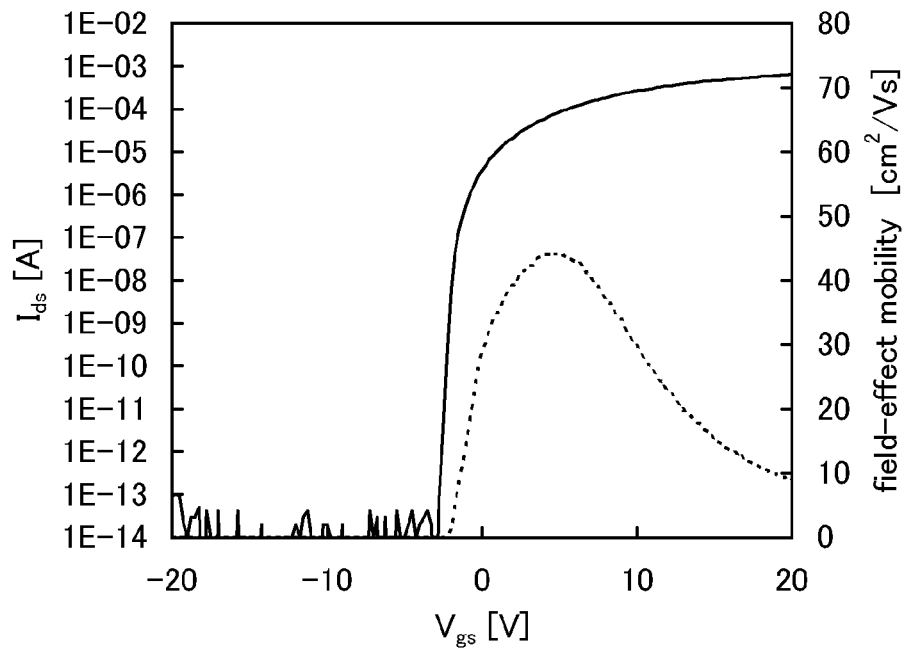
FIGS. 14A and 14B show $V_{gs}$-$I_{ds}$ characteristics and field-effect mobility of transistors of Samples 3 and 4.
Figure 14B:
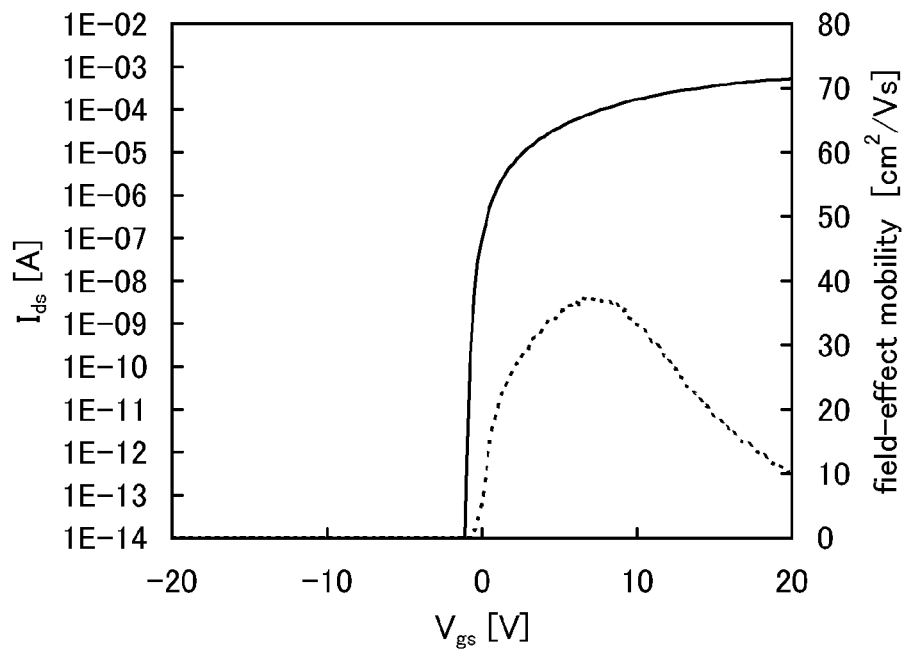

Here, FIG. 13A corresponds to Sample 1; FIG. 13B, Sample 2; FIG. 14A, Sample 3; and FIG. 14B, Sample 4.

It can be seen that in all the samples, switching characteristics were obtained in the transistors. Comparing Sample 1 with Samples 2 to 4, it is found that the field-effect mobility of the transistor is increased by performing heat treatment after formation of the oxide semiconductor film. This is deemed because the impurity concentration in the oxide semiconductor film was reduced by the heat treatment; accordingly, it is understood that the impurity concentration in the oxide semiconductor film was reduced by heat treatment performed after the oxide semiconductor film was formed, whereby the field-effect mobility of the transistor could be increased close to an ideal field-effect mobility.

As described above, it is found that the impurity concentration in the oxide semiconductor film was reduced by performing heat treatment after formation of the oxide semiconductor film, and the field-effect mobility of the transistor was able to be consequently increased.

Example 3

In this example, the transistors in Sample 1 and Sample 4 which were manufactured in Example 2 were subjected to BT tests.

The BT tests in this example are described. The transistors which were subjected to the BT tests had structures similar to that of the transistor described in Example 2.

First, $V_{gs}$-$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, 20 V was applied as $V_{gs}$ so that the intensity of an electric field applied to the gate insulating film 608 was 2 MV/cm, and the condition was kept for 1 hour. Next, $V_{gs}$ was changed to 0 V. Then, the $V_{gs}$-$I_{ds}$ characteristics of each transistor were measured again at the substrate temperature of 25° C. at $V_{ds}$ of 10 V. This is called a positive BT test.

In a similar manner, first, $V_{gs}$-$I_{ds}$ characteristics of each transistor were measured at a substrate temperature of 25° C. at $V_{ds}$ of 10 V. Then, the substrate temperature was changed to 150° C. and $V_{ds}$ was changed to 0.1 V. After that, −20 V was applied as $V_{gs}$ so that the intensity of an electric field applied to the gate insulating film 608 was −2 MV/cm, and the condition was kept for 1 hour. Next, $V_{gs}$ was changed to 0 V. Then, the $V_{gs}$-$I_{ds}$ characteristics of each transistor were measured again at the substrate temperature of 25° C. at $V_{ds}$ of 10 V. This is called a negative BT test.

Figure 15A:
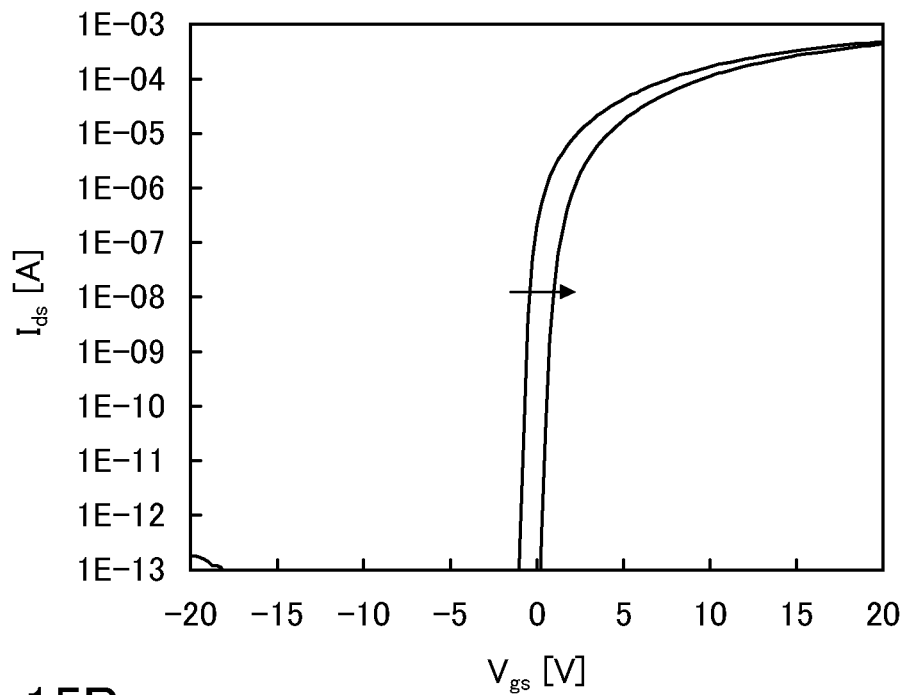
FIGS. 15A and 15B show $V_{gs}$-$I_{ds}$ characteristics of a transistor of Sample 1 before and after BT tests.
Figure 15B:
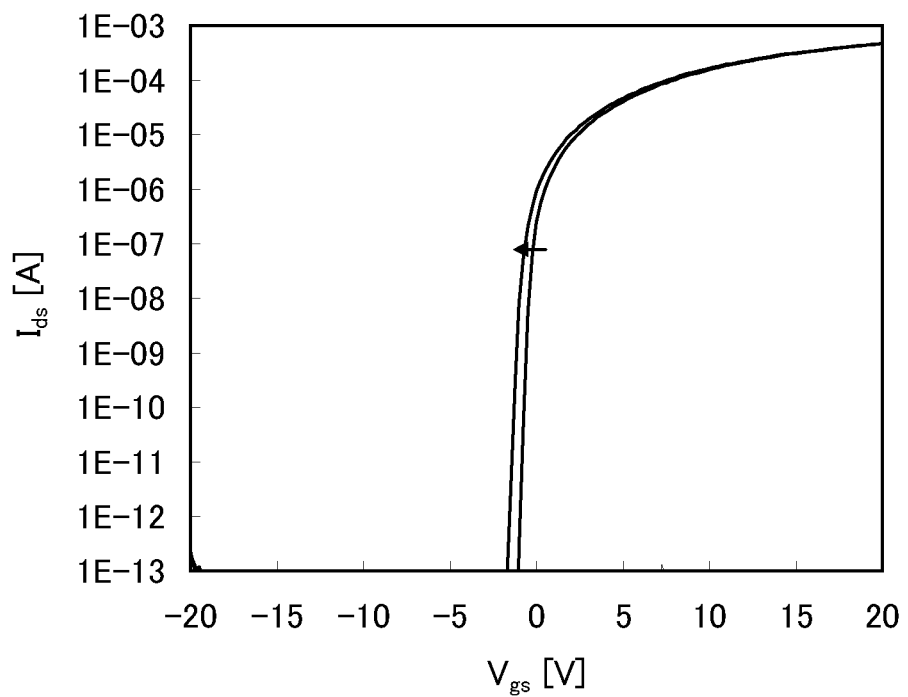
Figure 16A:
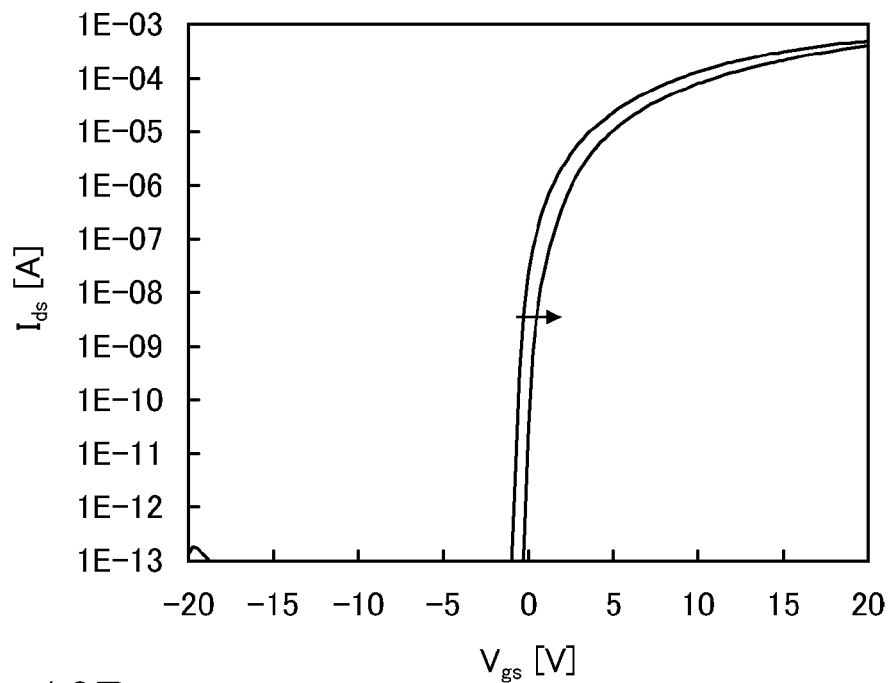
FIGS. 16A and 16B show $V_{gs}$-$I_{ds}$ characteristics of a transistor of Sample 4 before and after BT tests.
Figure 16B:
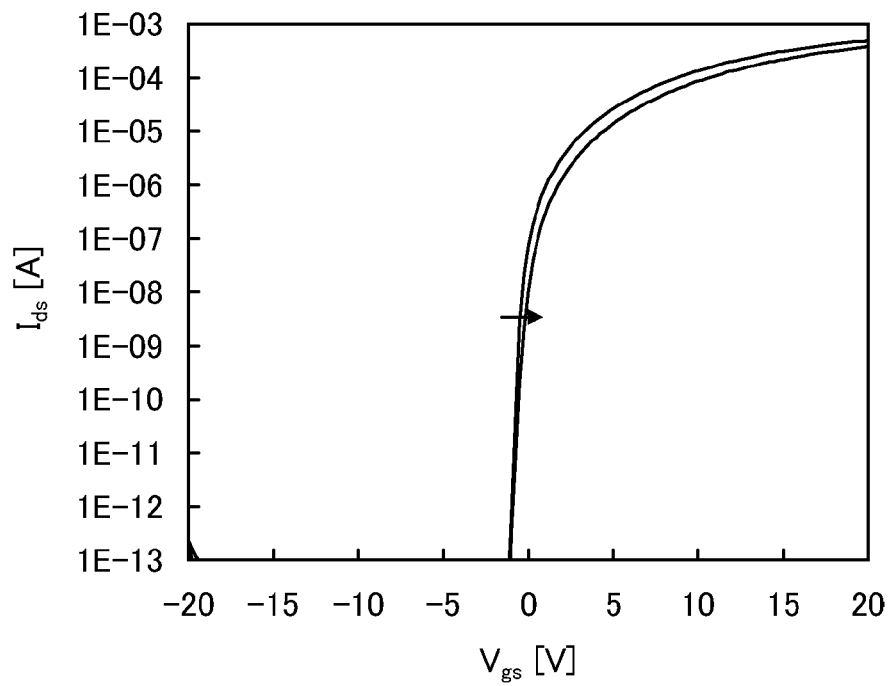

FIGS. 15A and 15B show a result of the positive BT test of Sample 1 and a result of the negative BT test of Sample 1, respectively. FIGS. 16A and 16B show a result of the positive BT test of Sample 4 and a result of the negative BT test of Sample 4, respectively. An arrow is given for clarifying a shift in $V_{gs}$-$I_{ds}$ characteristics measured before and after the BT test in each graph.

Respective amounts of shift in the threshold voltage of Sample 1 due to the positive BT test and due to the negative BT test were 1.80 V and −0.42 V. Respective amounts of shift in the threshold voltage of Sample 4 due to the positive BT test and due to the negative BT test were 0.79 V and 0.76 V.

It is found that, in each of Sample 1 and Sample 4, the amount of shift in the threshold voltage measured before and after the BT test is small and thus the reliability is high.

Example 4

In this example, a relation between the substrate temperature and the electrical characteristics of a transistor of Sample 4 which was manufactured in Example 2 was evaluated.

The transistor measured has a channel length L of 3 μm, a channel width W of 10 μm, Lov of 3 μm per side (6 μm in total), and dW of 0 μm. Further, $V_{ds}$ was set at 10 V. The substrate temperature was −40° C., −25° C., 25° C., 75° C., 125° C., and 150° C.

Figure 17:
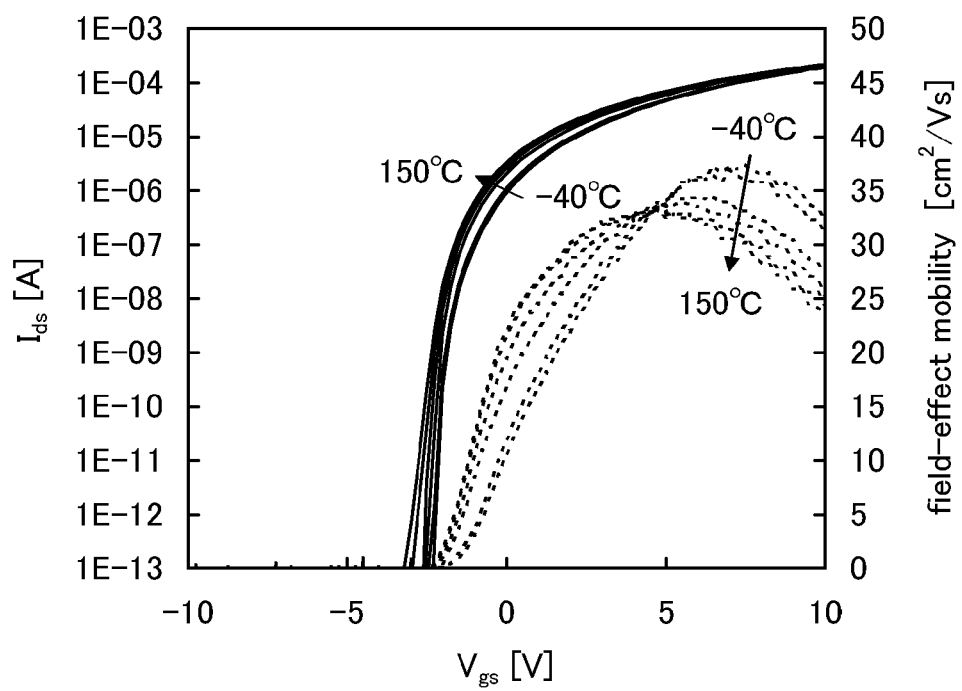
FIG. 17 shows variations in $V_{gs}$-$I_{ds}$ characteristics and field-effect mobility of a transistor of Sample 4 depending on measurement temperatures.
Figure 18A:
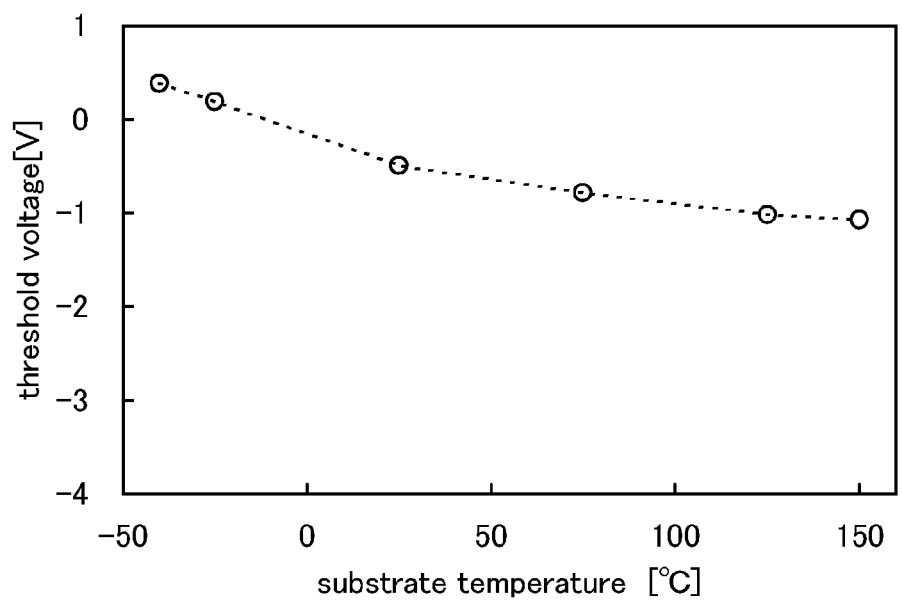
FIGS. 18A and 18B show relations between substrate temperature and threshold voltage or field-effect mobility of a transistor of Sample 4.

FIG. 17 shows the $V_{gs}$ dependence of $I_{ds}$ (a solid line) and field-effect mobility (a dotted line). FIG. 18A shows a relation between the substrate temperature and the threshold voltage, and FIG. 18B shows a relation between the substrate temperature and the field-effect mobility.

From FIG. 18A, it is found that the threshold voltage gets lower as the substrate temperature increases. The threshold voltage was decreased from 0.38 V to −1.08 V in the range from −40° C. to 150° C.

Figure 18B:
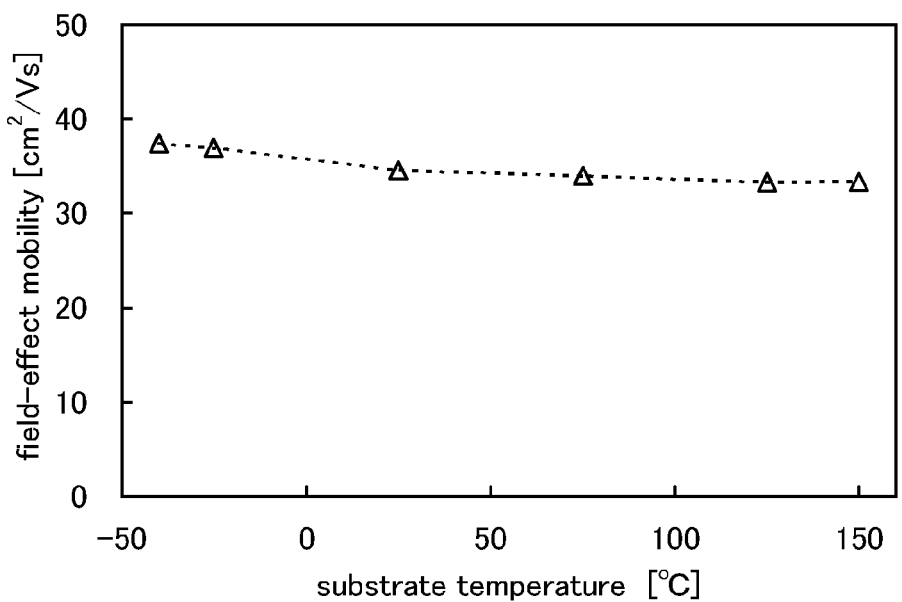

From FIG. 18B, it is found that the field-effect mobility gets lower as the substrate temperature increases. The field-effect mobility was decreased from 37.4 cm$^2$/Vs to 33.4 cm$^2$/Vs in the range from −40° C. to 150° C.

It is found that the electrical characteristics of Sample 4 shift less in the above temperature range.

Example 5

In this example, off-state current per micrometer of channel width of a transistor including an In—Sn—Zn—O film was measured.

The transistor used in the measurement has the structure which is described in Example 2 with reference to FIGS. 12A and 12B, where L is 3 μm, W is 10 cm, Lov is −2 μm, and dW is 0 μm. Note that the Lov of −2 μm means a structure (a structure including a so-called offset region ($L_{off}$)) in which the gate electrode 610 and the pair of electrodes 614 are not overlapped, and the width of a gap between the gate electrode 610 and each of the pair of electrodes 614 is 2 μm (4 μm in total).

Note that in this example, the oxide semiconductor film 606 and the gate insulating film 608 are each provided in a manner different from that in Example 2.

A method for forming the oxide semiconductor film 606 in this example is described below.

First, the In—Sn—Zn—O film as an oxide semiconductor film is formed to have a thickness of 15 nm.

The In—Sn—Zn—O film is formed with a sputtering apparatus with a power of 100 W (DC) in a mixed atmosphere of argon:oxygen=2:3 [volume ratio]. An In—Sn—Zn—O target of In:Sn:Zn=1:1:1 [atomic ratio] is used as a target. Note that substrate heating at the time of the film formation and heat treatment after the film formation are not performed.

Next, the oxide semiconductor film is processed by a photolithography process, so that the oxide semiconductor film 606 is formed.

Similarly, a method for forming the gate insulating film 608 is described below.

First, a 300-nm-thick silicon oxynitride film is formed as the gate insulating film 608.

The silicon oxynitride film is formed with a PCVD apparatus with a power of 150 W (RF) in a mixed atmosphere of monosilane:nitrous oxide=1:200. The substrate heating temperature in the film deposition is set at 400° C.

Note that in this example, the substrate 600, the base insulating film 602, the pair of electrodes 614, the gate electrode 610, the interlayer insulating film 616, the wirings 618, and the protective film 620 are formed using methods and materials similar to those employed in Example 2.

Figure 22:
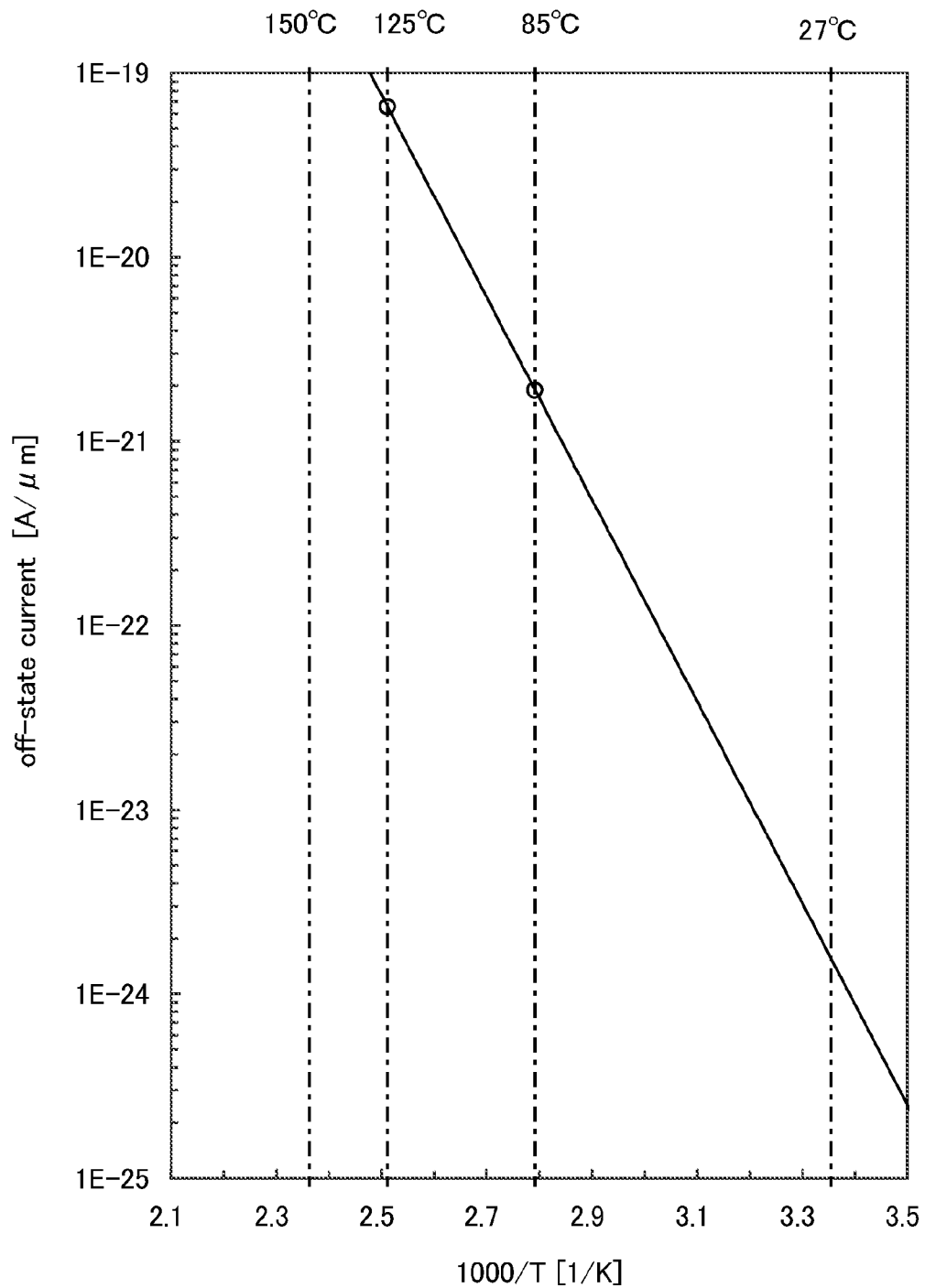
FIG. 22 shows off-state current of a transistor including an In—Sn—Zn—O film.

FIG. 22 shows a relation between the off-state current of the transistor and the inverse of the substrate temperature (absolute temperature) at measurement. For simplicity, a value (1000/T) obtained by multiplying the inverse of the substrate temperature at measurement by 1000 is indicated by the horizontal axis.

A method for measuring the off-state current of the transistor is simply described below. Note that a transistor which is an object to be measured is called a first transistor.

A drain of the first transistor is connected to a floating gate FG, and the floating gate FG is connected to a gate of a second transistor.

First, the first transistor is turned off, and an electric charge is supplied to the floating gate FG, where a certain drain voltage is applied to the second transistor.

Consequently, the electric charge at the floating gate FG gradually leaks through the first transistor to change the source potential of the second transistor. The amount of electric charge leaked from the first transistor can be estimated from that amount of change of the source potential in relation to time, whereby the off-state current can be measured.

From FIG. 22, off-state current per micrometer of channel width (unit: A/μm) of the transistor described in this example was $2 \times 10^{-21}$ A/μm (2 zA/μm) when the substrate temperature in the measurement was 85° C.

As described in this example, it is found that the off-state current of the transistor including the In—Sn—Zn—O film is extremely small.

This application is based on Japanese Patent Application serial No. 2011-106054 filed with Japan Patent Office on May 11, 2011, the entire contents of which are hereby incorporated by reference.

What is claimed is:

1. A method for manufacturing a semiconductor device, comprising the steps of:
   forming a base insulating film over a substrate;
   forming a protective insulating film in the base insulating film;
   forming an oxide semiconductor film over the protective insulating film at a substrate temperature higher than or equal to 100° C. and lower than or equal to 600° C.;
   after forming the oxide semiconductor film, performing heat treatment at a temperature higher than or equal to 250° C. and lower than or equal to 650° C.;
   forming a pair of electrodes in contact with the oxide semiconductor film;
   forming a gate insulating film over the oxide semiconductor film; and
   forming a gate electrode over the oxide semiconductor film with the gate insulating film provided therebetween,
   wherein an upper surface of the base insulating film and an upper surface of the protective insulating film are substantially flush with each other, and
   wherein the protective insulating film does not overlap with the gate electrode in a direction perpendicular to the substrate.

2. The method for manufacturing the semiconductor device according to claim 1, wherein a material of the oxide semiconductor film is any one of an In—Al—Sn—Zn—O-based material, an In—Sn—Zn—O-based material, an In—Al—Zn—O-based material, and a Zn—Sn—O-based material.

3. The method for manufacturing the semiconductor device according to claim 1, wherein oxygen is released from the base insulating film by heat treatment as a base of the oxide semiconductor film.

4. The method for manufacturing the semiconductor device according to claim 1, wherein the base insulating film is formed without being exposed to air after a surface on which the base insulating film is formed is subjected to treatment for removing an impurity.

5. A method for manufacturing a semiconductor device, comprising the steps of:
   forming a base insulating film over a substrate;
   forming a protective insulating film in the base insulating film;
   forming an oxide semiconductor film over the protective insulating film;
   forming a first insulating film over the oxide semiconductor film;
   forming a gate electrode over the oxide semiconductor film with the first insulating film provided therebetween;
   introducing an impurity reducing a resistance value of the oxide semiconductor film into the oxide semiconductor film by using the gate electrode as a mask;
   forming a second insulating film in contact with a side surface of the gate electrode;
   forming a gate insulating film and a sidewall insulating film in contact with the side surface of the gate electrode by processing the first insulating film and the second insulating film; and
   forming a pair of electrodes in contact with the oxide semiconductor film,
   wherein an upper surface of the base insulating film and an upper surface of the protective insulating film are substantially flush with each other, and
   wherein the protective insulating film does not overlap with the gate electrode in a direction perpendicular to the substrate.

6. The method for manufacturing the semiconductor device according to claim 5, further comprising the step of:
   performing heat treatment at a temperature higher than or equal to 250° C. and lower than or equal to 650° C. after the step of forming the oxide semiconductor film,
   wherein the step of forming the oxide semiconductor film is performed at a substrate temperature higher than or equal to 100° C. and lower than or equal to 600° C.

7. The method for manufacturing the semiconductor device according to claim 5, wherein a material of the oxide semiconductor film is any one of an In—Al—Sn—Zn—O-based material, an In—Sn—Zn—O-based material, an In—Al—Zn—O-based material, and a Zn—Sn—O-based material.

8. The method for manufacturing the semiconductor device according to claim 5, wherein oxygen is released from the base insulating film by heat treatment as a base of the oxide semiconductor film.

9. The method for manufacturing the semiconductor device according to claim 5, wherein the base insulating film is formed without being exposed to air after a surface on which the base insulating film is formed is subjected to treatment for removing an impurity.

10. A method for manufacturing a semiconductor device, comprising the steps of:
   forming a base insulating film over a substrate;
   forming a protective insulating film in the base insulating film;
   forming an oxide semiconductor film over the protective insulating film;

forming a first insulating film over the oxide semiconductor film;

forming a gate electrode over the oxide semiconductor film with the first insulating film provided therebetween;

forming a second insulating film in contact with a side surface of the gate electrode;

forming a gate insulating film and a sidewall insulating film in contact with the side surface of the gate electrode by processing the first insulating film and the second insulating film;

introducing an impurity reducing a resistance value of the oxide semiconductor film into the oxide semiconductor film; and forming a pair of electrodes in contact with the oxide semiconductor film, wherein an upper surface of the base insulating film and an upper surface of the protective insulating film are substantially flush with each other, wherein the protective insulating film does not overlap with the gate electrode in a direction perpendicular to the substrate, wherein the oxide semiconductor film includes a first region and a second region, wherein the first region of the oxide semiconductor film overlaps with the gate electrode in the direction perpendicular to the substrate, wherein the second region of the oxide semiconductor film does not overlap with the gate insulating film in the direction perpendicular to the substrate, and wherein a resistance value of the second region of the oxide semiconductor film is lower than a resistance value of the first region of the oxide semiconductor film.

11. The method for manufacturing the semiconductor device according to claim 10, further comprising the step of:

performing heat treatment at a temperature higher than or equal to 250° C. and lower than or equal to 650° C. after the step of forming the oxide semiconductor film, wherein the step of forming the oxide semiconductor film is performed at a substrate temperature higher than or equal to 100° C. and lower than or equal to 600° C.

12. The method for manufacturing the semiconductor device according to claim 10, wherein a material of the oxide semiconductor film is any one of an In—Al—Sn—Zn—O-based material, an In—Sn—Zn—O-based material, an In—Al—Zn—O-based material, and a Zn—Sn—O-based material.

13. The method for manufacturing the semiconductor device according to claim 10, wherein oxygen is released from the base insulating film by heat treatment as a base of the oxide semiconductor film.

14. The method for manufacturing the semiconductor device according to claim 10, wherein the base insulating film is formed without being exposed to air after a surface on which the base insulating film is formed is subjected to treatment for removing an impurity.

* * * * *